US011558170B2

(12) United States Patent
Poulsen et al.

(10) Patent No.: US 11,558,170 B2
(45) Date of Patent: Jan. 17, 2023

(54) PHASE-LOCKED LOOP WITH DUAL INPUT REFERENCE AND DYNAMIC BANDWIDTH CONTROL

(71) Applicant: Synaptics Incorporated, San Jose, CA (US)

(72) Inventors: Jens Kristian Poulsen, Ontario (CA); Lorenzo Crespi, Costa Mesa, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/536,410

(22) Filed: Nov. 29, 2021

(65) Prior Publication Data

US 2022/0191001 A1 Jun. 16, 2022

Related U.S. Application Data

(60) Provisional application No. 63/126,439, filed on Dec. 16, 2020.

(51) Int. Cl.
*H04L 7/033* (2006.01)
(52) U.S. Cl.
CPC .................................. *H04L 7/0331* (2013.01)
(58) Field of Classification Search
CPC ....... H04L 7/0331; H03L 7/087; H03L 7/107; H03L 7/143; H03L 7/1976
See application file for complete search history.

(56) References Cited

U.S. PATENT DOCUMENTS

| 8,059,778 | B1 * | 11/2011 | Do ........................ H03L 7/113 331/11 |
| 9,065,459 | B1 | 6/2015 | Buell |
| 2009/0274255 | A1 | 11/2009 | Li |
| 2011/0087347 | A1 | 4/2011 | Hammond et al. |
| 2019/0280696 | A1 * | 9/2019 | Wang .................... H03L 7/0807 |

FOREIGN PATENT DOCUMENTS

GB  2409383 A  6/2005

OTHER PUBLICATIONS

Partial European Search Report from European Patent Application No. 21213371.4, dated Apr. 26, 2022, 13 pages.

* cited by examiner

*Primary Examiner* — Jean B Corrielus
(74) *Attorney, Agent, or Firm* — Paradice & Li LLP

(57) ABSTRACT

Disclosed herein are systems and methods for improved performance of phase-locked loop based clock generators, particularly in the context of wireless audio. A PLL clock generator includes a PLL core configured to receive a module reference clock provided by a communications module and generate a subsystem data clock corresponding to a module data clock of the communications module; and a data clock tracker module configured to receive the module data and subsystem data clocks and determine a corresponding data clock correction factor. The bandwidth of the PLL core may be dynamically changed thereby enabling both fast and very precise settling. The PLL core may use a low jitter frequency reference for the phase detector while an a synchronous and jitter-prone audio sample clock is used to ensure a mean frequency of the PLL core tracks the audio sample clock.

20 Claims, 12 Drawing Sheets

PHASE-LOCKED LOOP WITH DUAL INPUT REFERENCE AND DYNAMIC BANDWIDTH CONTROL

CROSS-REFERENCE TO RELATED APPLICATION

This application claims priority and benefit under 35 USC § 119(e) to U.S. Provisional Patent Application No. 63/126,439, filed on Dec. 16, 2020, which is incorporated herein by reference in its entirety.

TECHNICAL FIELD

The present disclosure, in accordance with one or more embodiments, relates generally to phase-locked loops (PLLs) and, more particularly for example, to systems and methods using PLLs to generate stable clock signals.

BACKGROUND

Many modern devices such as laptop computers, computer tablets, MP3 players, smart phones, and audio receivers provide for wireless source, speaker, and/or headphone connectivity. Stable clocking in an audio subsystem of such devices can be difficult to accomplish, particularly when one or more of the wirelessly interconnected devices is portable and wireless communication links can degrade or drop due to interference and/or distance. Audio subsystems may employ phase-locked loop (PLL) based clock generators in an attempt to provide stable clocking of the audio subsystem, but conventional PLL based clock generators may "lose lock" and cause the audio subsystem to suffer audible audio capture and/or reproduction errors and/or other operational errors when an associated wireless communication link degrades, for example, or they incorporate a mitigation mechanism that significantly increases system complexity and power consumption. Due to miniaturization and desired portability of modern devices and increased performance requirements, there is a continued need to improve both power consumption and overall performance of such devices.

SUMMARY

The present disclosure provides systems and methods that address a need in the art for improved performance of phase-locked loop (PLL) based clock generators, particularly in the context of wireless audio.

In one embodiment, a PLL clock generator includes a PLL core having an input to receive, from a communications module, a module reference clock signal having a first frequency, where the PLL core is configured to generate a subsystem data clock signal based, at least in part, on the module reference clock signal. The PLL clock generator further includes a data clock tracker module configured to receive, from the communications module, a module data clock signal having a second frequency that varies in relation to the first frequency and to determine a data clock correction factor based, at least in part, on the module data clock signal and subsystem data clock signal. The PLL core may be further configured to adjust the subsystem data clock signal based, at least in part, on the data clock correction factor.

In another embodiment, a method includes receiving, from a communications module, a module reference clock signal having a first frequency and a module data clock signal having a second frequency that varies in relation to the first frequency; generating a subsystem data clock signal based, at least in part, on the module reference clock signal; determining a data clock correction factor based, at least in part, on the module data clock signal and the subsystem data clock signal; and adjusting the subsystem data clock signal based, at least in part, on the data clock correction factor.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

Figure 1A:
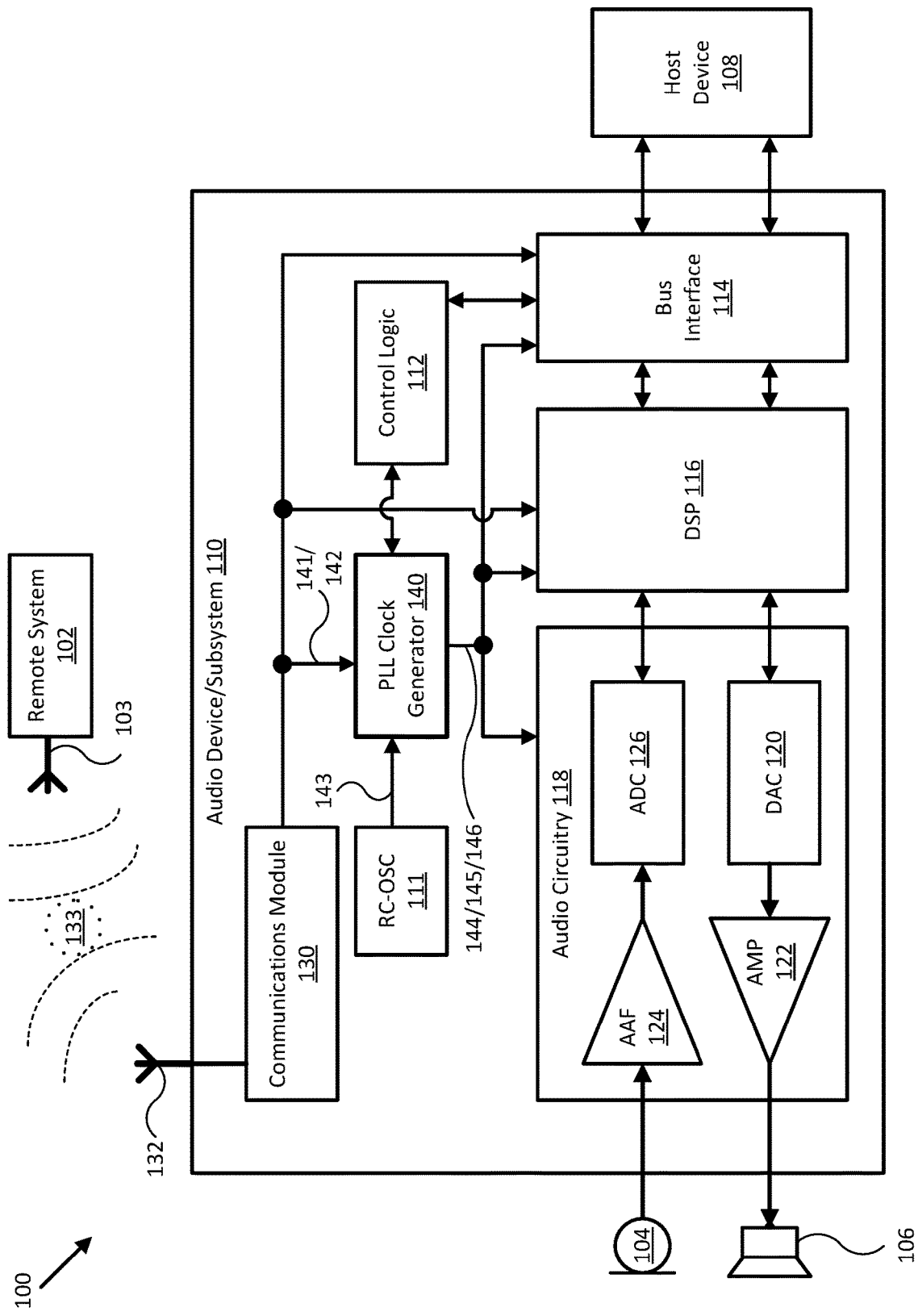
FIG. 1A is a block diagram of a wireless audio system including an audio subsystem with a PLL based clock generator, in accordance with one or more embodiments of the present disclosure.

The present disclosure provides systems and methods that address a need in the art for improved performance of phase-locked loop (PLL) based clock generators used in low power devices. The PLL based clock generators disclosed herein can maintain a relatively stable clock output through loss of a reference clock input and can consume less power than conventional systems while reducing or eliminating audio artifacts associated with clock errors present in conventional systems. In particular, embodiments are able to use the combination of a reference clock and a data clock sourced from a communications module to generate a relatively stable and jitter free system reference clock and subsystem data clock even while the data clock transitions between frequencies or time bases. The reference clock may be used as a primary PLL phase reference while the data clock may be used to fine adjust the exact operating frequency to ensure a received data rate (e.g., audio sample rate) matches a transmitted data rate (e.g., audio sample rate). Related embodiments are able to use a relatively unstable and jitter-prone subsystem clock to generate the relatively stable and jitter free system reference clock and subsystem data clock even when the communications module reference and data clocks become unavailable, such as when an associated wireless communication link degrades or drops. Embodiments are able to compensate for transitions between such states without suffering the kinds of timing errors that cause operational errors, such as an audio subsystem suffering audible audio capture and/or reproduction errors, and without incorporating a mitigation mechanism that significantly increases system complexity and power consumption, such as an asynchronous sample rate converter (ASRC).

For example, in order to produce a high-performance audio subsystem, it is important to have a reference clock with low jitter. Unfortunately, conventional Bluetooth™ (BT) chips and/or other communications modules do not normally provide a low jitter clock reference that can be used simultaneously as the audio sampling clock (e.g., to generate or reproduce digital audio, as described herein). An ASRC typically requires significant system resources to implement and increases power consumption, and so an alternative methodology is needed. Embodiments of the PLL based clock generator described herein are able to use an output from a BT chip, where a module reference clock integrated within the communications module (e.g., a 24.00 MHz clock, for BT chips) is directly divided by an integer to provide a low jitter clock source for a PLL based clock generator, while a module data clock (e.g., an I2S bus BITCLK, for BT chips) is used to provide a data clock reference (e.g., an audio sample clock reference) for the PLL based clock generator. The latter is used for fine corrections of the feedback and/or output of the PLL based clock generator so that, for example, the audio output sample rate from the BT chip will match the sample rate provided by the PLL based clock generator, without needing an ASRC. In other words, the low jitter module reference clock may be used as the direct input for the PLL phase comparator while the jittery audio sample clock/module data clock will be used for long term fine adjustments of the PLL divisor ratio. This way, both low jitter and avoidance of ASRC may be obtained, thereby obtaining low power and high performance.

In one embodiment, a PLL based clock generator may use a delta-sigma modulator to control a PLL core of the generator. This may be done by changing the programmed feedback divider value that controls the output frequency from the voltage-controlled oscillator (VCO) of the PLL core. However, it is important to notice that the output from the VCO cannot both be locked to the BT module reference clock and at the same time to the BT module data clock. The reason for this is that the ratio between these two clock sources may not be a rational number and can drift over time. Thus, embodiments described herein may include a PLL core with a fractional divider that is fine adjusted by the module data clock while the PLL uses the low jitter module reference clock as the phase reference. In this way, the average frequency of the PLL core will closely track the input module data clock while short term the low jitter module reference clock will be used as the phase reference input path for the PLL core in order to obtain low jitter output from the PLL core. In this way, embodiments can track the data (e.g., the audio samples), obtain low jitter, and avoid ASRCs.

FIG. 1A is a block diagram of a wireless audio system 100 including an audio subsystem 110 with a PLL based clock generator 140, in accordance with one or more embodiments of the present disclosure. In particular, FIG. 1A shows audio device/subsystem 110 communicating audio data wirelessly over wireless communication link 133 with remote system 102, via communications module 130 and antennas 132 and 103, as shown. Audio device/subsystem 110 may be implemented as and/or integrated within a laptop computer, a computer tablet, a portable audio player, a headphone system, a headphone system with integrated automatic noise suppression, a smartphone, an audio receiver, a television, and/or other portable or stationary audio device or subsystem, which may in some embodiments be linked and/or integrated with a host device 108 (e.g., other elements of a portable or stationary audio device, including a display/user interface). In general, audio system 100 may be configured to capture, generate, process, and/or wirelessly transmit audio and/or audio data between the various elements of audio system 100, including microphone 104 and speaker/earpieces/earphones/headphones 106, among a variety of other audio transducers.

Figure 1B:
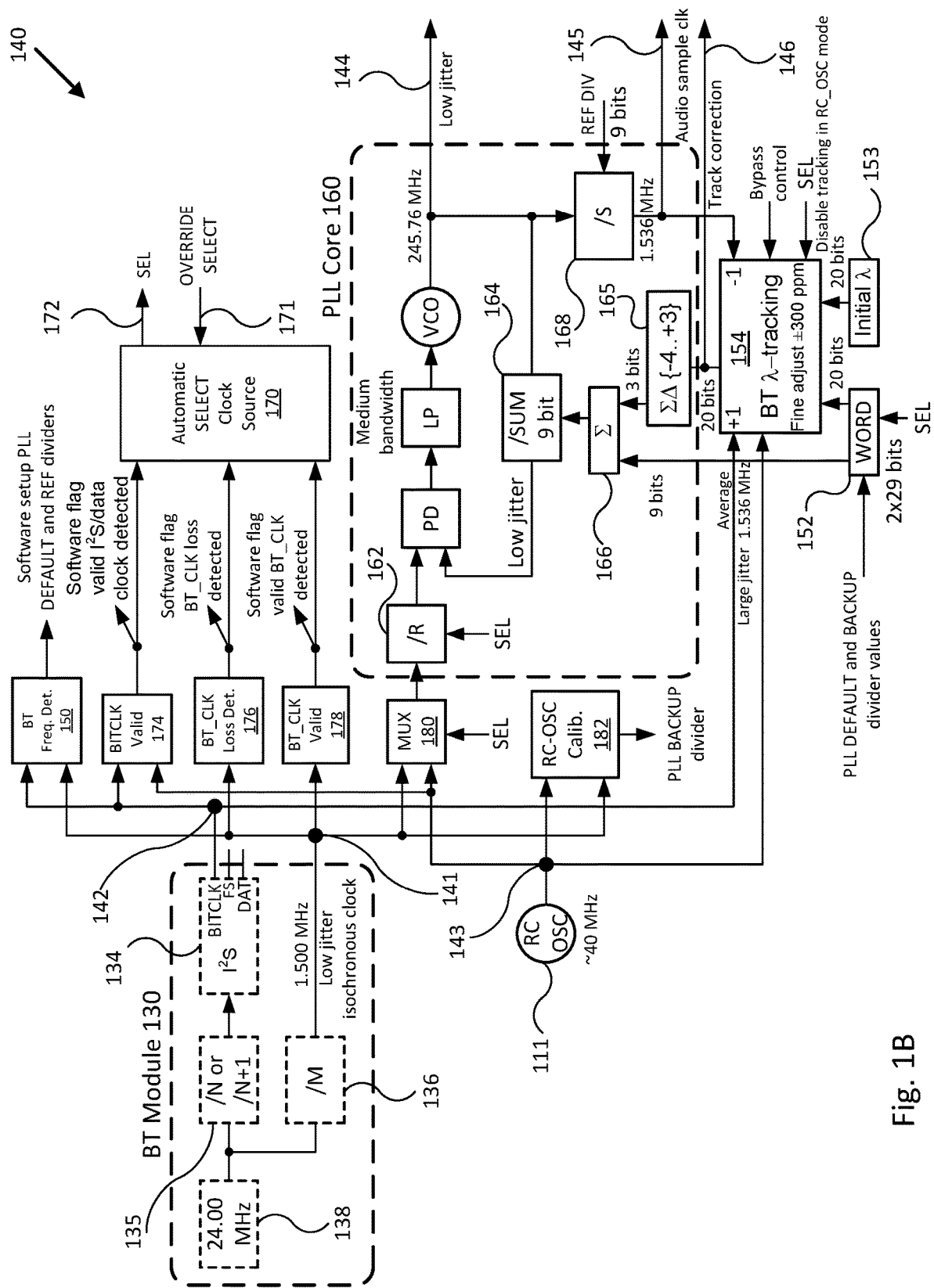
FIG. 1B is a block diagram of a PLL based clock generator, in accordance with one or more embodiments of the present disclosure.

In FIG. 1A, audio device/subsystem 110 includes communications module 130 providing module reference clock input 141 and module data clock input 142 to PLL clock generator 140 and subsystem alternate clock source (RC-OSC) 111 providing secondary/subsystem clock input 143 (e.g., a subsystem clock signal) to PLL clock generator 140, where PLL clock generator 140 is configured to generate a subsystem reference clock output 144, a subsystem data clock output 145, and optionally a data clock correction output 146, as described in more detail with reference to FIG. 1B, which may be used for timing and synchronization of various other elements of audio device/subsystem 110, such as control logic 112, bus interface 114, digital signal processor (DSP) 116, and audio circuitry 118, and to facilitate operation of audio device/subsystem 110 and/or PLL clock generator 140, as described herein. In various embodiments, and as described herein, PLL clock generator 140 may be configured to provide the subsystem data clock output 145 while the variable module data clock frequency of module data clock input 142 varies between at least two different frequencies and without injecting timing errors into the subsystem data clock that would cause the ANC processing to generate an audible artifact. Communications module 130 may also be configured to provide audio data and/or other data to various elements of audio device/subsystem 110.

Control logic 112 may be implemented as any appropriate logic device (e.g., processing device, microcontroller, processor, application specific integrated circuit (ASIC), field programmable gate array (FPGA), memory storage device, memory reader, or other device or combinations of devices) that may be adapted to execute, store, and/or receive appropriate instructions, such as software instructions implementing a control loop for controlling various operations of audio device/subsystem 110 and/or other elements of system 100, for example. Control logic 112 may be configured to control and/or configure operation of PLL clock generator 140, for example, and may be configured to store, receive, and/or forward corresponding control and/or configuration data to and from various other elements of system 100 via bus interface 114.

Audio circuitry 118 may include a variety of elements, such as audio input circuitry including an antialiasing filter/amplifier 124 configured to receive analog audio signals transduced by microphone 104 and provide analog processed signals to an analog to digital converter (ADC) 126, which may be configured to provide corresponding digital audio to DSP 116 for additional processing, such as active noise cancelling (ANC). Audio circuitry 118 may also include audio output circuitry including a digital to analog converter (DAC) 120 configured to receive (processed) digital audio from DSP 116 and provide corresponding analog audio to amplifier 122, which provides analog processes signals to be transduced into audio sound waves by speaker/headphones 106. DSP 116 may be configured to provide various types of signal processing, including equalization, band filtering, spatial filtering, and/or other processing, in addition to ANC, for example, and may be configured to exchange both audio data and control parameters with DAC 120 and ADC 126 to facilitate such processing and according to a particular application or overall host device architecture. Bus interface 114 may be configured to support communications (e.g., data and/or control data communications) among various elements of audio device/subsystem 110 and/or between such elements and host device 108.

In the context of many operational applications, such as a voice-over-IP applications or other applications that process voices and/or voice commands, audio device/subsystem 110 may be configured to perform audio input/output processing substantially in real-time (e.g., with relatively low delay compared to human hearing characteristics), which may include communication through bus interface 114. In such embodiments, the loss of a reference clock signal may impact the ability of audio device/subsystem 110 to perform necessary audio processing and communications, such as by causing the device to miss a voice command, for example, or insert an audio error into a stream of audio data. Embodiments of PLL clock generator 140 allow for relatively stable operation of audio circuitry 118, DSP 116, and bus interface 114, for example, even during the loss of a module reference clock, as described herein.

FIG. 1B is a block diagram of PLL clock generator 140, in accordance with one or more embodiments of the present disclosure. In general, each of the elements of PLL clock generator 140 may be implemented by logic elements, analog circuit elements, and/or other circuit elements or circuitry as appropriate. As shown in FIG. 1B, PLL clock generator 140 may be configured to receive one or more clock inputs 141-143 and generate relatively stable and jitter free clock outputs 144-145 based, at least in part, on clock inputs 141-143, for example, and/or various control words/registers provided to PLL clock generator 140 (e.g., by control logic 112 and/or determined through operation of PLL clock generator 140. In some embodiments, PLL clock generator 140 may be configured to generate a subsystem reference clock/output 144 and a subsystem data clock/output 145 based on module reference clock input 141 (generated by module clock 138 and clock divider/module reference clock source 136) and module data clock input 142 provided by module data clock source 134. In some embodiments, clock dividers 135 and/or 136 may be supplemented and/or replaced with other clock generation logic. In related embodiments, PLL clock generator 140 may be configured to generate subsystem reference clock 144 and subsystem data clock 145 based on secondary clock input 143 provided by subsystem clock source (RC-OSC) 111, such as when module reference clock input 141 and/or module data clock input 142 are invalid and/or otherwise unavailable.

In various embodiments, BT communications module 130 may be configured to provide a module I2S data clock output BITCLK from module data clock source 134 that, even at a given audio sample rate, may swap between two clock frequencies (as implemented in silicon). For example, in some cases, the period between individual bits in a single data word may be relatively stable, but the timing between data words may not be constant so as to accommodate for differences between the module reference clock and the received data clock rate timing. Thus, if the output sample rate is (approximately) 1.536 MHz, the chip may swap between the use of 1.500 and 1.600 MHz, which follows the output of the combination of module clock 138 and duty cycle divider 135. Common (average) module data clock rates include 1.536, 1.4112, 1.024, 0.512, and 0.256 MHz, as BITCLK rates. Because BT communication module 130 receives data from remote system 102, and because remote (audio) system 102 uses a different clock source, there may be timing differences between the received data clocking and module clock 138. Communications module 130 may also be configured to provide a module reference clock BT_CLK from a module reference clock source 136, which follows the output of module clock 138 as divided by a simple integer (e.g., as implemented by clock divider/module reference clock source 136), as shown.

More generally, PLL clock generator 140 may be configured to accommodate more frequency variability than simply swapping between two frequencies (e.g., the case of two frequencies is not the most general situation). The more general situation is that PLL clock generator 140 may be provided a relatively stable reference clock with low jitter but not of the desired clock frequency (e.g., BT_CLK) and a relatively high-jitter data clock (e.g., BITCLK) that may be used to control the output clock frequency of PLL core 160. The reference clock BT_CLK may be used as the PLL clock reference while the jittery data clock BITCLK may be used to make micro-adjustments to the output clock frequency, because the reference clock BT_CLK may not be exactly aligned with the desired data/output clock frequency. Furthermore, by dynamically adjusting PLL bandwidth, it is possible to control PLL core 160 to provide both a fast response to changes in frequency and have a high attenuation of jitter. These two parameters normally represent a design compromise, where systems cannot have a high quality of both. By using a wider bandwidth when there is a larger discrepancy between the data clock frequency and the output clock frequency and a normal relatively narrow bandwidth when the discrepancy is smaller, it is possible to speed up the loop response for fast changes and obtain very low jitter once a signal has settled.

Because the module reference clock BT_CLK output from module reference clock source 136 of communications module 130 can provide a well-defined reference frequency, module reference clock BT_CLK may be used to accurately measure the frequency of the module data clock BITCLK. This way, the correct settings for the PLL dividers can be determined, because initially the data clock rate of communications module 130 may not be known. For example, module data clock frequency detector 150 may be configured to perform an accurate measurement of a frequency of module data clock input 142 within approximately 1 ms, which will take the large variation in the frequency of module data clock BITCLK into account. In some embodiments, module data clock frequency detector 150 may be configured to output the detected frequency in kHz without the need for any scaling. The detected frequency may be stored (e.g., as a DEFAULT divider value, or a REFERENCE divider value) and used by software (e.g., executed by control logic 112 and/or host device 108) to calculate a PLL control word 1, which may be stored (e.g., as a DEFAULT divider value) in a select register 152, as shown.

Figure 2:
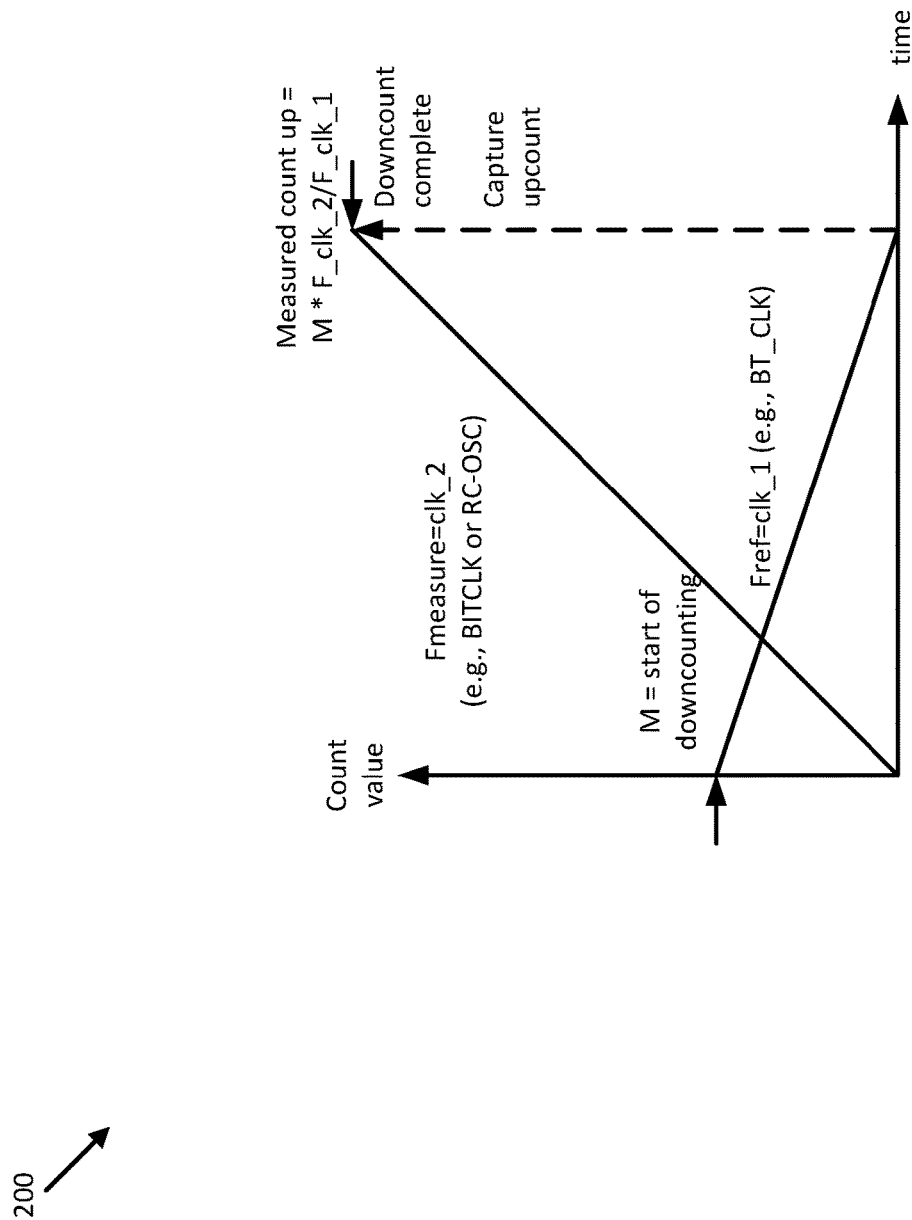
FIG. 2 is a graph illustrating a simplified frequency detection process for a PLL based clock generator, in accordance with one or more embodiments of the present disclosure.

In a particular embodiment, module data clock frequency detector 150 may be configured to measure the frequency of module data clock BITCLK using a simplified frequency detection process, for example, and provide an estimated module data clock frequency to software (e.g., control logic 112 and/or host device 108), so that the correct divisor/setup values for PLL core 160 and/or other elements of PLL clock generator 140 can be determined, as described herein. For example, FIG. 2 shows graph 200 illustrating a simplified frequency detection process for module data clock frequency detector 150 of PLL clock generator 140, in accordance with one or more embodiments of the present disclosure.

In general, module data clock frequency detector 150 may need to be able to distinguish between the following clock frequencies: Fin={0.512, 1.024, 1.4112 and 1.536 MHz}. In some embodiments, module data clock frequency detector 150 may be configured to measure the ratio between two clock sources and multiply the clock source ratio by a constant. Thus, the output may be Measured_value=M×Fdetect/Fref=M×F_clk_2/F_clk_1. In order to perform a reasonably precise measurement, multiple clock periods should be used. With M=15000, the frequency estimate has a resolution of 100 Hz at a measurement time of 10 ms. The constant M will determine number of cycles of the reference clock Fref (e.g., F_clk_1) used during the measurement. If M=1500 and Fref=1.500 MHz, the output measured frequency will be given directly in kHz, and so no division and no multiplication is needed to perform the calculation (and no system resources need to be allocated to perform such operations). As shown in FIG. 2, the measurement may be performed based on a dual-slope technique, which may be implemented by module data clock frequency detector 150. First, a count value M is provided to module data clock frequency detector 150. Second, a reference clock (e.g., module reference clock BT_CLK, F_clk_1) with a known frequency and a clock source (e.g., module data clock BITCLK, F_clk_2) with an unknown frequency are provided to module data clock frequency detector 150. The reference clock is used to count a first counter down M times while a second counter counts up from zero according to the clock source. When the first counter has reached one, the value of the second counter will be the desired value (ratio of the two clock frequencies multiplied by the constant M).

As noted above, PLL clock generator 140 may be configured to generate subsystem reference clock 144 and subsystem data clock 145 based on module reference clock BT_CLK input 141 and module data clock BITCLK input 142, where both subsystem reference clock 144 and subsystem data clock 145 are generated by PLL core 160 of PLL clock generator 140. For example, as shown in FIG. 1B, PLL core 160 may include a PLL input divider 162, a phase detector, and a low pass filter (e.g., with a medium bandwidth) all feeding a VCO used to generate subsystem reference clock 144. Subsystem reference clock 144 may be provided to reference divider 168, which is used to generate subsystem data clock 145 based, at least in part, on the module data clock frequency estimate provided by module data clock frequency detector 150, as described herein. In some embodiments, module data clock frequency detector 150 may be omitted from PLL clock generator 140, such as if the audio sample rate is already available (e.g. provided by control commands sent over an VC bus). Subsystem reference clock 144 may also be provided to loop divider 164, which generates a loop feedback signal for the phase detector and/or PLL core 160 in order for PLL core 160 to operate as a PLL.

Module data clock BITCLK will in general not be aligned with module reference clock BT_CLK since it is ultimately generated by remote system/external source 102. PLL clock generator 140 must compensate for this variation through use of data clock tracker module 154. Therefore, in some embodiments, the loop feedback signal generated by loop divider 164 within PLL core 160 may be based, at least in part, on a data clock correction factor provided by data clock tracker module 154. Such data clock correction factor may be limited, filtered, stored, and/or forwarded by loop divider adjuster/delta sigma modulator 165 (and added to an integer by loop divider accumulator 166 to generate the loop divider value for loop divider 164), for example, such as forwarded to loop divider accumulator 166, which may be configured to combine the data clock correction factor with at least a portion of a control word (e.g., a DEFAULT divider value or a BACKUP divider value) provided by select register 152 and provide the combined value as a divider value to loop divider 164, as shown. Such data clock correction factor may also be provided (e.g., as data clock correction output 146) to other elements of audio system 100 downstream of PLL clock generator 140 to track such data clock correction factor, for example, or to use such data clock correction factor to facilitate and/or control other operations of such other elements.

In general, data clock tracker module 154 may be configured to automatically track any timing discrepancies, such as those associated with frequency swapping in the module data clock BITCLK and/or slow changes in frequency due to changes in module reference clock BT_CLK or internal clocking of remote system 102 to ensure there is a match between incoming and outgoing data samples and determine a data clock correction for PLL core 160 to compensate for such discrepancies. For example, at a 48 kHz sample rate, even a deviation of 200 ppm from the ideal value will only provide an extra 9.6 samples per second. Thus, in order to determine an accurate correction, data clock tracker module 154 may have a relatively very narrow bandwidth, from a few tens of Hz down to fractions of a Hz. To ensure relatively fast tracking and high accuracy, data clock tracker module 154 may be configured to use a faster time constant initially and then narrow the bandwidth to reduce jitter as much as possible and simultaneously optimize the settling time. Put differently, data clock tracker module 154 may be configured to provide a wider bandwidth for PLL core 160 as the module data clock frequency diverges from a subsystem data clock frequency of the subsystem data clock 145 and a narrower bandwidth for PLL core 160 as the subsystem data clock frequency converges to the module data clock frequency.

As shown in FIG. 1B, data clock tracker module 154 may be configured to receive and compare module data clock BITCLK to the divided output subsystem data clock 145 provided by PLL core 160 to ensure that PLL core 160 will accurately track minor deviations in the sample rate from BT communications module 130 and generate a tracking, accurate, substantially jitter free phase locked subsystem data clock 145. Such data clock tracking is used to avoid the use of an ASRC, eliminate situations of buffer overflow/underflow, and ensure relatively low power consumption.

Figure 3A:
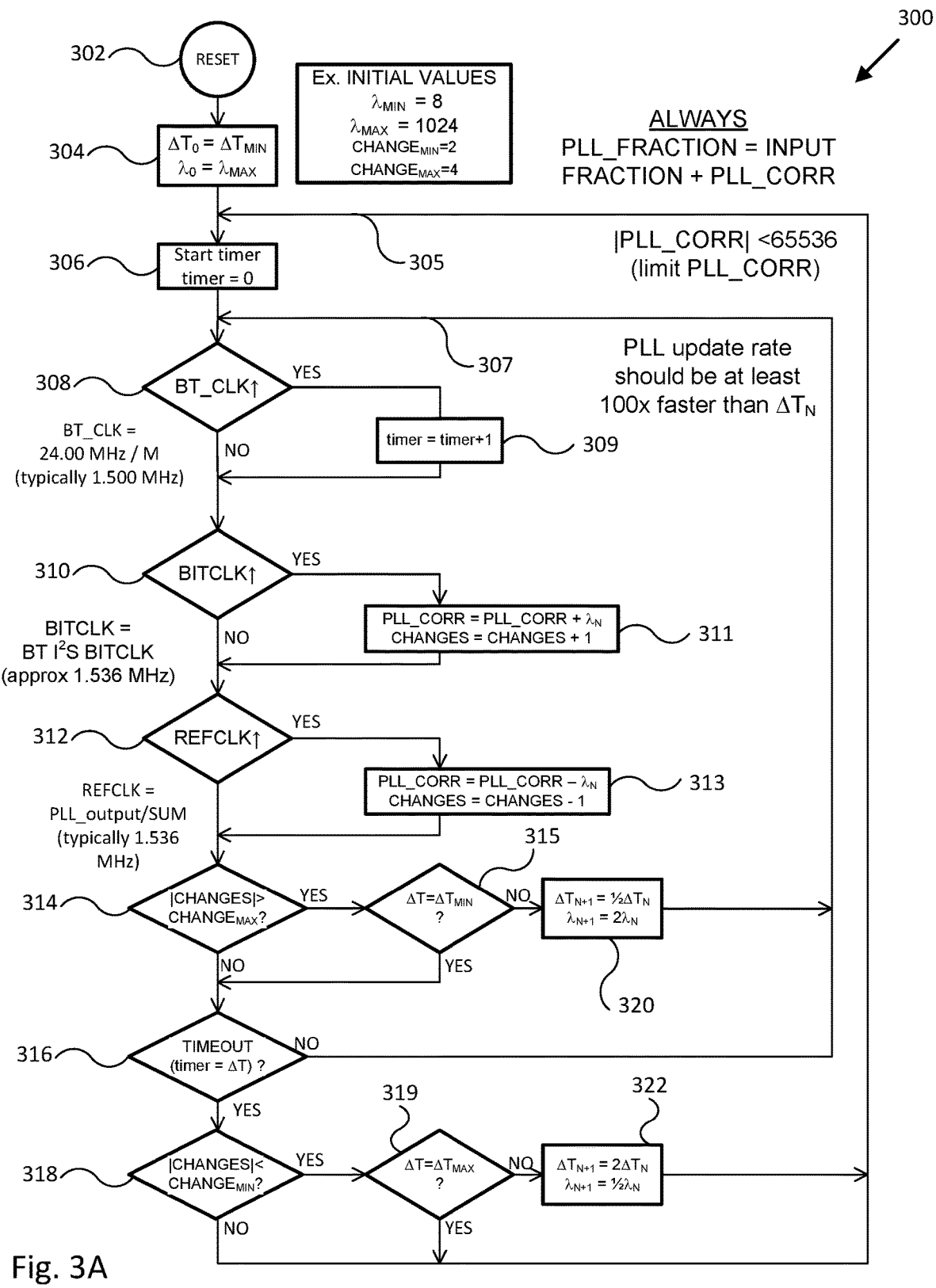
FIG. 3A is a flow diagram illustrating a process for providing data clock tracking, in accordance with one or more embodiments of the disclosure.

In various embodiments, data clock tracker module 154 may be configured to implement the data clock tracking process illustrated in FIG. 3A. For example, when implementing such process, the following parameters are suggested: initial time constant $T_0=\Delta t=0.0625$ seconds (approximately, not critical); and $\lambda_0=1024=\lambda_{MAX}$. These initialization values will set the initial bandwidth. Later, clock tracker module 154 may reduce the bandwidth to reduce jitter. Moreover, if the frequency abruptly changes subsequently, a built-in control compensates for such situation. In general, with respect to such process, if more than a total of four correction changes in either direction are accumulated over a single accumulation period $T_N$ (i.e. the frequency goes up or down an accumulated four units), then the convergence speed will be increased (until $T_N=T_{MIN}$ is reached): $\{T_{N+1}=\frac{1}{2}T_N$ and $\lambda_{N+1}=2\lambda_N\}$. In other words, when there is a relatively quick change in frequency, the duration of the accumulation period will be decreased by a factor of two and the update gain will be increased by a factor of two, and if this happens, a new period will be started immediately after such adjustment. However, if the count of four correction changes is not reached, then at the end of any accumulation period the process will still have completed some adjustment of the PLL loop. For example, unless $T_N=T_{MAX}$ then the process will perform the following adjustment $\{T_{N+1}=2T_N$ and $\lambda_{N+1}=\frac{1}{2}\lambda_N\}$. In other words, if there are no substantial correction changes, the accumulation period will be increased by a factor of two and the update gain will be decreased by a factor of two. The process will continue to reduce the bandwidth, until the maximum accumulation period is reached (i.e. the minimum update gain is reached). An example algorithm is shown in FIG. 3A.

FIG. 3A is a flow diagram illustrating a process 300 for providing data clock tracking in PLL clock generator 140, in accordance with one or more embodiments of the disclosure. At block 302, data clock tracker module 154 may be configured to perform a reset, which may include setting various control registers and/or process variables to the example initial values, which may be based on other control parameters of PLL clock generator 140, as described herein. At block 304, data clock tracker module 154 may be configured to initialize various process variables, such as initializing the initial accumulation period to the minimum accumulation time period and the initial update gain to the maximum update gain (e.g., so as to be maximumly responsive).

At block 306, data clock tracker module 154 may be configured to enter a primary tracking loop 305 of process 300, initialize a loop timer to zero, and start the loop timer.

At block 308, data clock tracker module 154 may be configured to enter a secondary tracking loop 307 of process 300, detect a positive edge of module reference clock BT_CLK, and increment the loop timer (e.g., in block 309), for example, or, in the alternative, proceed to block 310. Such loop timer may be used to dynamically control the bandwidth of PLL core 160, as described herein. In alternative embodiments, other reference clocks may be used to increment the loop timer.

At block 310, data clock tracker module 154 may be configured to detect a positive edge of module data clock BITCLK and increment a PLL correction factor by the present update gain and increment the accumulated changes by 1 (e.g., in block 311), for example, or, in the alternative, proceed to block 312. For example, when a sample has been received from BT communications module 130, PLL core 160 will be controlled (e.g., by data clock tracker module 154) to operate faster because the divider value for loop divider 164 increases (e.g., a higher divider value with a fixed input reference will increase the PLL output frequency). At block 312, data clock tracker module 154 may be configured to detect a positive edge of subsystem data clock 145 and decrement the PLL correction factor by the present update gain and decrement the accumulated changes by 1 (e.g., in block 313), for example, or, in the alternative, proceed to block 316. For example, when a sample has been offloaded by the audio subsystem, data clock tracker module 154 will decrease the divider value for loop divider 164 and decrease the PLL output frequency. More generally, data clock tracker module 154 may be configured to monitor signal edges of the module data clock BITCLK and the subsystem data clock 145 and accumulate PLL corrections based, at least in part, on a difference between a first number of signal edges of module data clock BITCLK and a second number of signal edges of subsystem data clock 145, the adjustable update gain of primary tracking loop 305, and the adjustable accumulation period of primary tracking loop 305.

At block 314, data clock tracker module 154 may be configured to compare the absolute value of the present accumulated changes to a maximum allowed change within a single accumulation period and either proceed to block 315 (e.g., if the present accumulated changes are greater than the maximum allowed change) or to block 316 (e.g., if the present accumulated changes are NOT greater than the maximum allowed change). At block 315, data clock tracker module 154 may be configured to determine whether the present accumulation period is equal to a minimum accumulation period, for example, and either proceed to block 320 (e.g., if the present accumulation period is NOT equal to the minimum accumulation period) or proceed to block 316 (e.g., if the present accumulation period is equal to the minimum accumulation period). For example, when embodiments detect many changes in one direction (block 314), it means there has been a rapid change in the BT output audio sample rate. In this case, it will benefit the settling of the loop by making it faster. This is done in block 320, provided the fastest setting has not been reached, as detected by block 315. Block 315 is also beneficial for the stability of the entire loop. Very fast changes could result in oscillations of loop divider 164 without ever reaching a stable setting. At block 320, data clock tracker module 154 may be configured to decrease the present accumulation period by half and increase the present update gain by a factor of 2, exit secondary tracking loop 307, and proceed back to block 306 and reenter primary tracking loop 305 with the updated accumulation period and update gain.

At block 316, data clock tracker module 154 may be configured to determine whether the present loop accumulation period has expired, based on the value of the loop timer initialized and started in block 306 and the present accumulation period (e.g., initialized in block 304), for example, and either loop back to block 308 (present loop accumulation period has NOT expired) or exit secondary tracking loop 307 and proceed to block 318. At block 318, data clock tracker module 154 may be configured to compare the absolute value of the present accumulated changes to a minimum allowed change within a single accumulation period and either proceed to block 319 (e.g., if the present accumulated changes are less than the minimum allowed change) or loop back to block 306 (e.g., if the present accumulated changes are NOT less than the minimum allowed change). In some embodiments, block 318 may be omitted and process 300 may always proceed along the "Yes" path to block 319.

At block 319, data clock tracker module 154 may be configured to determine whether the present accumulation period is equal to a maximum accumulation period, for example, and either loop back to block 306 (e.g., if the present accumulation period is equal to the maximum accumulation period) or proceed to block 322 (e.g., if the present accumulation period is NOT equal to the minimum accumulation period). At block 322, data clock tracker module 154 may be configured to increase the present accumulation period by a factor of 2 and decrease the present update gain by half, and loop back to block 306 and reenter primary tracking loop 305 with the updated accumulation period and update gain. Blocks 320 and 322 may be implemented relatively compactly by increasing/decreasing the various parameters by a power of 2. In various embodiments, block 322 decreases the adaptation speed but also decreases jitter. This is beneficial for slow changing input audio sample rates to reduce output jitter levels. This happens when block 319 detects that the minimum allowed bandwidth has not been reached. Block 318 detects if there are very few changes and may be optionally omitted, as described herein. A limit to the minimum bandwidth detected by block 319 may be beneficial to implementation of process 300 for numerical reasons.

In some embodiments, process 300 may be implemented according to simplified update gain values. The table below shows simplified update gain values for real register transfer level (RTL) implementations. Embodiments may use 2.25× $2^{16}$=0x2 4000 0000 as the natural time constant with the module data clock BITCLK controlling this counter. Such value can be represented with few bits, lowering power consumption. In the counter loop, only 5 bits (the 5 most significant bits/MSBs) need to be checked.

| Desired clock [MHz] | Count change required for ±300 ppm deviation | Time constant optimal loop [ms] | Simplified $\lambda_0$ | Simplified $\{\lambda_{MIN}, \lambda_{MAX}\}$ | Simplified $T_0$ |
|---|---|---|---|---|---|
| 0.5120 | ±21558 | 292 | 1024 | {8, 1024} | 96 ms |
| 1.0240 | ±10779 | 146 | 1024 | {8, 1024} | 96 ms |
| 1.4112 | ±7827 | 106 | 1024 | {8, 1024} | 96 ms |
| 1.5360 | ±7193 | 98 | 1024 | {8, 1024} | 96 ms |
| 2.0480 | ±5393 | 73 | 1024 | {8, 1024} | 96 ms |
| 2.8224 | ±3913 | 53 | 1024 | {8, 1024} | 96 ms |
| 3.0720 | ±3595 | 49 | 1024 | {8, 1024} | 96 ms |

Error analysis on PLL fractional divider adjustment using embodiments of data clock tracker module 154 may proceed as follows. The basic PLL frequency multiplication factor is as follows:

$$N_{INTEGER} + \left[7 \cdot \left(\frac{N_{FRAC}}{2^{20}-4}\right) - 4\right] \quad (1)$$

It can be seen that the fraction bits are approximately multiplied by 7. In addition to this, the relative influence on the output is affected by the division ratio. If there is a very large division ratio (e.g., 500), the influence of one least significant bit (LSB) will be much smaller than if there is a smaller division ratio (e.g., 50). The following table is based on a 245.76 MHz subsystem reference clock and 1 ppm error, and the resulting change in frequency is as follows (the integer part means a LSB results in less change): change=245.76×$10^6$×7×$2^{-20}$/Division factor=1640.625/Division factor. The aim is to support changes up to at least +/−300 ppm. The change in frequency for 1 ppm will result in a frequency change of 245.76 Hz. A frequency change of 300 ppm will result in a frequency change of 73.728 kHz. The table below shows what offset count in the fractional PLL update is required to correct such changes.

| Desired clock [MHz] | Division factor | One LSB change results in this change [Hz] | One LSB change relative in ppm | Count change required for ±300 ppm deviation | Time constant optimal loop [ms] |
|---|---|---|---|---|---|
| 0.5120 | 480.000 | 3.42 | 0.014 | ±21558 | 292 |
| 1.0240 | 240.000 | 6.84 | 0.028 | ±10779 | 146 |
| 1.4112 | 174.150 | 9.42 | 0.038 | ±7827 | 106 |
| 1.5360 | 160.000 | 10.25 | 0.042 | ±7193 | 98 |
| 2.0480 | 120.000 | 13.67 | 0.056 | ±5393 | 73 |
| 2.8224 | 87.075 | 18.84 | 0.077 | ±3913 | 53 |
| 3.0720 | 80.000 | 20.51 | 0.083 | ±3595 | 49 |

The relative change in ppm is =$10^6$×7×$2^{-20}$/Division factor=6.67572/Division factor. It can be seen from the table, that if the changes in the fractional increment are kept to less than 12 (1/0.083), the changes will always be below 1 ppm. It can be seen from the table, that if a 16-bit count value is used, embodiments will be able to correct changes up to 456>300 ppm in all cases. This limitation may also be used to ensure that the adjustments don't go into the unstable range of the PLL fractional sigma-delta update. In other words, the PLL update correction will be limited to {−32768 . . . +32767}.

Figure 3B:
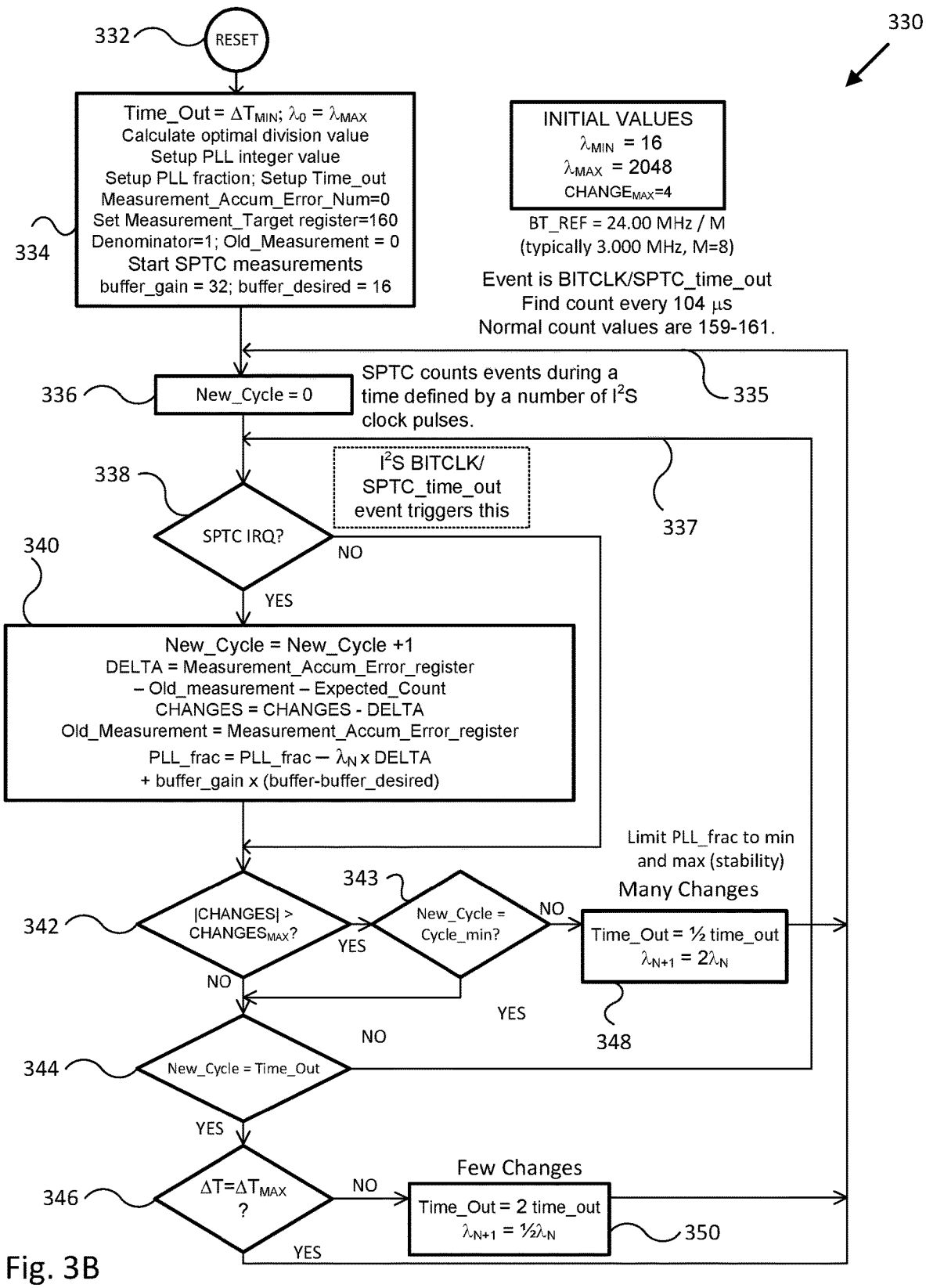
FIG. 3B is a flow diagram illustrating a process for providing data clock tracking, in accordance with one or more embodiments of the disclosure.

FIG. 3B is a flow diagram illustrating a process 330 for providing data clock tracking in PLL clock generator 140, in accordance with one or more embodiments of the disclosure. In general, process 330 is similar to process 300 of FIG. 3A, but where the cycling of primary tracking loop 305 is controlled by a special purpose timer/counter module (SPTC) and/or associated interrupt requests (IRQs), as shown in FIG. 3B. In such embodiments, such SPTC may be driven by module data clock BITCLK, for example, with feedback from subsystem data clock output 145. In various embodiments, such SPTC may be integrated with data clock tracker module 154 and, in some embodiments, may include a pre-divider module configured to generate interrupt requests. More generally, such SPTC may be implemented as part of a software module integrated with data clock tracker module 154. In such embodiments, PLL core 160 may be configured to operate under conditions where clock divider/module reference clock source 136 provides a divided version of the output of module clock 138 or feeds through the output of module clock 138 (e.g., divider value=1) as an input to PLL core 160, for example, or subsystem clock source (RC-OSC) 111 is provided as an input to PLL core 160 (e.g. via reference signal multiplexor 180).

In general terms, process 330 may be described as follows. $T_0=\lambda t=0.053$ seconds (approximately, not critical), thus for BITCLK=1.536 MHz, and pre-divider=160, the IRQ is generated every 104 µs, so Time_Out=512 (initial value). $\lambda_0=2048=\lambda_{MAX}$. If embodiments encounter more than a total of four changes in either direction over a single period $T_N$ (i.e. the frequency goes up or down an accumulated of four units), then embodiments will increase the convergence speed (until Time_Out=Time_Out$_{MIN}$ is reached): {Time_Out=½Time_Out and $\lambda_{N+1}=2\lambda N$}. In other words, when embodiments see a quick change in frequency, embodiments will decrease the duration of a time unit by a factor of two and increase the update constant by a factor of two. If this happens, embodiments will immediately start a new period after this adjustment. However, if embodiments did not reach the count of four changes, then at the end of any period embodiments will still have completed some adjustment of the PLL loop. Now, unless embodiments have reached $T_N=T_{MAX}$ then embodiments will perform the following adjustment: {Time_Out=2 Time_Out and $\lambda_N+1=\frac{1}{2}\lambda_N$}. In other words, when embodiments detect no substantial changes, embodiments will increase the update duration by a factor of two and decrease the update constant by a factor of two. Embodiments will continue to do so, until the maximum time duration is reached (i.e. the minimum update factor is reached).

At block 332, data clock tracker module 154 may be configured to perform a reset, which may include setting various control registers and/or process variables to the example initial values, which may be based on other control parameters of PLL clock generator 140, as described herein. At block 334, data clock tracker module 154 may be configured to initialize various process variables, as shown, such as initializing the initial accumulation period to the minimum accumulation time period and the initial update gain to the maximum update gain (e.g., so as to be maximumly responsive).

At block 336, data clock tracker module 154 may be configured to enter a primary tracking loop 335 of process 330 and initialize a loop timer (New Cycle) to zero. At block 338, data clock tracker module 154 may be configured to enter a secondary tracking loop 337 of process 330, determine if an SPTC IRQ is pending, and either increment the loop timer (e.g., in block 340) and update various data clock tracker parameters, for example, or, in the alternative, proceed to block 342. At block 340, data clock tracker module 154 may be configured to determine a data clock delta measurement, adjust the accumulated changes using the data clock delta measurement, and adjust a PLL correction factor based on the present update gain and/or the data clock delta measurement, for example, as shown. In some embodiments, at block 340, a correction is made both for the difference between the expected and actual counts (DELTA) but also for a desired buffer level. In other words, there is built in a mechanism that automatically tracks the current buffer level, and by integration of the current error from a desired buffer level, correct the receiver speed to ensure this buffer level is maintained. This will act as an extra safety guard with the respect to receiving data. Normally, the correction factor for checking the buffer level will involve a numerically smaller constant "buffer gain" as compared to the current $\lambda N$ that corrects for the difference between the measured and expected count values to ensure stability of the loop. Such safety guard may also be included in the methodology described in FIG. 3A (e.g. included in update blocks 311 and 313).

At block 342, data clock tracker module 154 may be configured to compare the absolute value of the present accumulated changes to a maximum allowed change within a single accumulation period and either proceed to block 343 (e.g., if the present accumulated changes are greater than the maximum allowed change) or to block 344 (e.g., if the present accumulated changes are NOT greater than the maximum allowed change). At block 343, data clock tracker module 154 may be configured to determine whether the present accumulation period is equal to a minimum accumulation period, for example, and either proceed to block 348 (e.g., if the present accumulation period is NOT equal to the minimum accumulation period) or proceed to block 344 (e.g., if the present accumulation period is equal to the minimum accumulation period). For example, when embodiments detect many changes in one direction (block 342), it means there has been a rapid change in the BT output audio sample rate. In this case, it will benefit the settling of the loop by making it faster. This is done in block 348, provided the fastest setting has not been reached, as detected by block 343. Block 343 is also beneficial for the stability of the entire loop. Too fast changes could result in oscillations of loop divider 164 without ever reaching a stable setting. At block 348, data clock tracker module 154 may be configured to decrease the present accumulation period by half and increase the present update gain by a factor of 2, exit secondary tracking loop 337, and proceed back to block 336 and reenter primary tracking loop 335 with the updated accumulation period and update gain.

At block 344, data clock tracker module 154 may be configured to determine whether the present loop accumulation period has expired, based on the value of the loop timer initialized and started in block 336 and the present accumulation period (e.g., initialized in block 334), for example, and either loop back to block 338 (present loop accumulation period has NOT expired) or exit secondary tracking loop 337 and proceed to block 346. At block 346, data clock tracker module 154 may be configured to determine whether the present accumulation period is equal to a maximum accumulation period, for example, and either loop back to block 336 (e.g., if the present accumulation period is equal to the maximum accumulation period) or proceed to block 350 (e.g., if the present accumulation period is NOT equal to the minimum accumulation period). At block 350, data clock tracker module 154 may be configured to increase the present accumulation period by a factor of 2 and decrease the present update gain by half, and loop back to block 336 and reenter primary tracking loop 335 with the updated accumulation period and update gain. Blocks 348 and 350 may be implemented relatively compactly by increasing/decreasing the various parameters by a power of 2. In various embodiments, block 350 decreases the adaptation speed but also decreases jitter. This is beneficial for slow changing input audio sample rates to reduce output jitter levels. This happens when block 346 detects that the minimum allowed bandwidth has not been reached. A limit to the minimum bandwidth detected by block 346 may be beneficial to implementations of process 330 for numerical reasons.

Figure 3C:
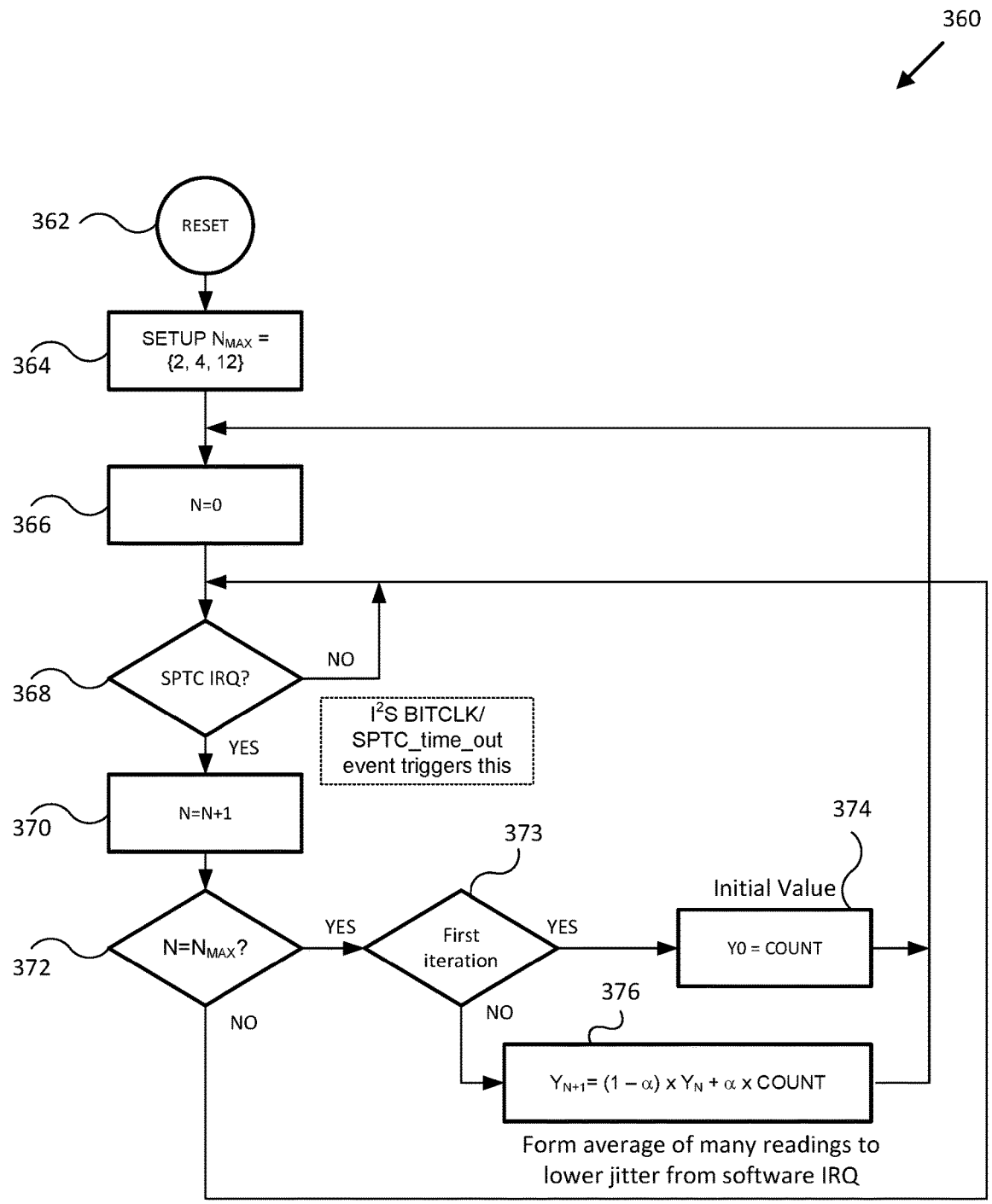
FIG. 3C is a flow diagram illustrating a process for providing data clock tracking, in accordance with one or more embodiments of the disclosure.

FIG. 3C is a flow diagram illustrating a process 360 for providing data clock tracking and calibration in PLL clock generator 140, in accordance with one or more embodiments of the disclosure. In particular, process 360 generates an average of a counter sum provided by special purpose timer/counter module (SPTC) so as to reduce jitter introduced by a software implemented IRQ. At block 362, data clock tracker module 154 may be configured to perform a reset, which may include setting various control registers and/or process variables to the example initial values, which may be based on other control parameters of PLL clock generator 140, as described herein. At block 364, data clock tracker module 154 may be configured to initialize various process variables, as shown, such as initializing the averaging parameter (e.g., the number of counts to average). At block 366, the element count is set to zero. At block 368, data clock tracker module 154 may be configured to determine if an SPTC IRQ is pending and either loop back to block 368 or, in the alternative, proceed to block 370, where the element count is incremented by 1 and process 360 proceeds to block 372. At block 372, data clock tracker module 154 may be configured to determine if the element count is equal to the averaging parameter and either loop back to block 368 or, if the element count has reached the averaging parameter, proceed to block 373. At block 373, data clock tracker module 154 may be configured to determine whether the present iteration is the first iteration (e.g., N=1), and if so, proceed to block 374, which initializes the count average to the present count output by the SPTC. If not, process 360 proceeds to block 376, which averages multiple readings of the count output by the SPTC. The averaging process as shown in block 376 may be used to perform an accurate calibration of an alternative clock source, such as subsystem alternate clock source (RC-OSC) 111.

Accordingly, as described herein, data clock tracker module 154 implementing any of processes 300, 330, and/or 360 may be configured to increase or decrease one or more of an adjustable update gain and an adjustable accumulation period associated with a primary tracking loop based, at least in part, on the module data clock and the subsystem data clock, where the adjustable update gain and the adjustable accumulation period are configured to provide a relatively coarse and fast tracking data clock correction factor as the module data clock frequency diverges from the subsystem data clock frequency and a relatively fine and slow tracking data clock correction factor as the subsystem data clock frequency converges to the module data clock frequency, for example, and where the adjustable update gain and the adjustable accumulation period are configured to provide a wider bandwidth for PLL core 160 as the module data clock frequency diverges from a subsystem data clock frequency of the subsystem data clock and a narrower bandwidth for PLL core 160 as the subsystem data clock frequency converges to the module data clock frequency. In particular embodiments, data clock tracker module 154 implementing any of processes 300, 330, and/or 360 may be configured to increase or decrease each of the adjustable update gain and the adjustable accumulation period by a multiplicative factor equal to one half or two based, at least in part, on the accumulated PLL corrections, where the data clock correction factor is based, at least in part, on the adjustable update gain and/or the adjustable accumulation period, as described herein. In other embodiments, the control of loop bandwidth may use other step sizes than two or even employ a virtually continuous variation in the bandwidth control.

As is also noted above, PLL clock generator 140 may be configured to generate subsystem reference clock 144 and subsystem data clock 145 based on secondary clock input 143 provided by subsystem clock source (RC-OSC) 111, such as when module reference clock input 141 and/or module data clock input 142 are invalid and/or otherwise unavailable. In such embodiments, various elements of PLL clock generator 140 may be configured to detect the unavailability of module reference clock input 141 and/or module data clock input 142, couple secondary clock input 143 to PLL core 160, and modify various elements of PLL core 160 to generate subsystem reference clock 144 and subsystem data clock 145 at approximately the same frequencies generated via module reference clock input 141 and/or module data clock input 142 before they became unavailable, for example, and without PLL core losing lock and risking injection of timing errors into subsystem reference clock 144 and subsystem data clock 145. Note that if the BT signal is lost, there will be no incoming audio data. Thus, while audio system 110 may still be used for other audio operations, such as active noise cancellation, there is no longer an incoming data clock. Thus, the incoming audio/data clock rate will no longer be compared to the outgoing audio/data clock rate. Instead, RC-OSC 111 will be used as the reference clock and the PLL divider ratio will be maintained at one value. This value should be determined before the BT signal is lost and should ensure the PLL frequency will not change substantially during the change of clock reference. For example, the RC-OSC frequency may be calibrated in a similar manner to that described with reference to module data clock frequency detector 150, which may be implemented by subsystem clock calibrator 182, for example, and/or by using process 360 as shown in FIG. 3C, as described herein.

In particular, module data clock validity detector 174, module reference clock loss detector 176, module reference clock validity detector 178, and/or clock select logic module 170 may be configured to monitor module reference clock input 141 and/or module data clock input 142 and generate reference/secondary clock selector signal SEL 172 configured to control various elements of PLL clock generator 140 to use secondary clock input 143 to generate module reference clock input 141 and/or module data clock input 142.

Module data clock validity detector 174 may be configured to detect the presence of a valid module data clock BITCLK and determine whether it is stable and in the expected correct frequency range. In some embodiments, any signal in the range 0.2-4 MHz may be considered a valid module data clock BITCLK. In various embodiments, module data clock BITCLK may be determined as stable by determining the frequency variability over eight clock periods is within a preselected maximum allowable variability (e.g., preselected to account for the expected variability of module data clock BITCLK, as described herein). Module data clock validity detector 174 may be configured to encode the validity state/the data clock validity status of the module data clock BITCLK in logic (e.g., 0/1, true/false, high/low) and forward the validity state to clock select logic module 170. More generally, module data clock validity detector 174 may be configured to detect a valid module data clock BITCLK and provide an indicator/data clock validity status to be used as an interrupt for PLL clock generator 140. In some embodiments, module data clock validity detector 174 may be configured to detect any clock in the frequency range 0.2-4.0 MHz and/or provide a clock valid signal after eight clock cycles each of approximate equal length.

Figure 4:
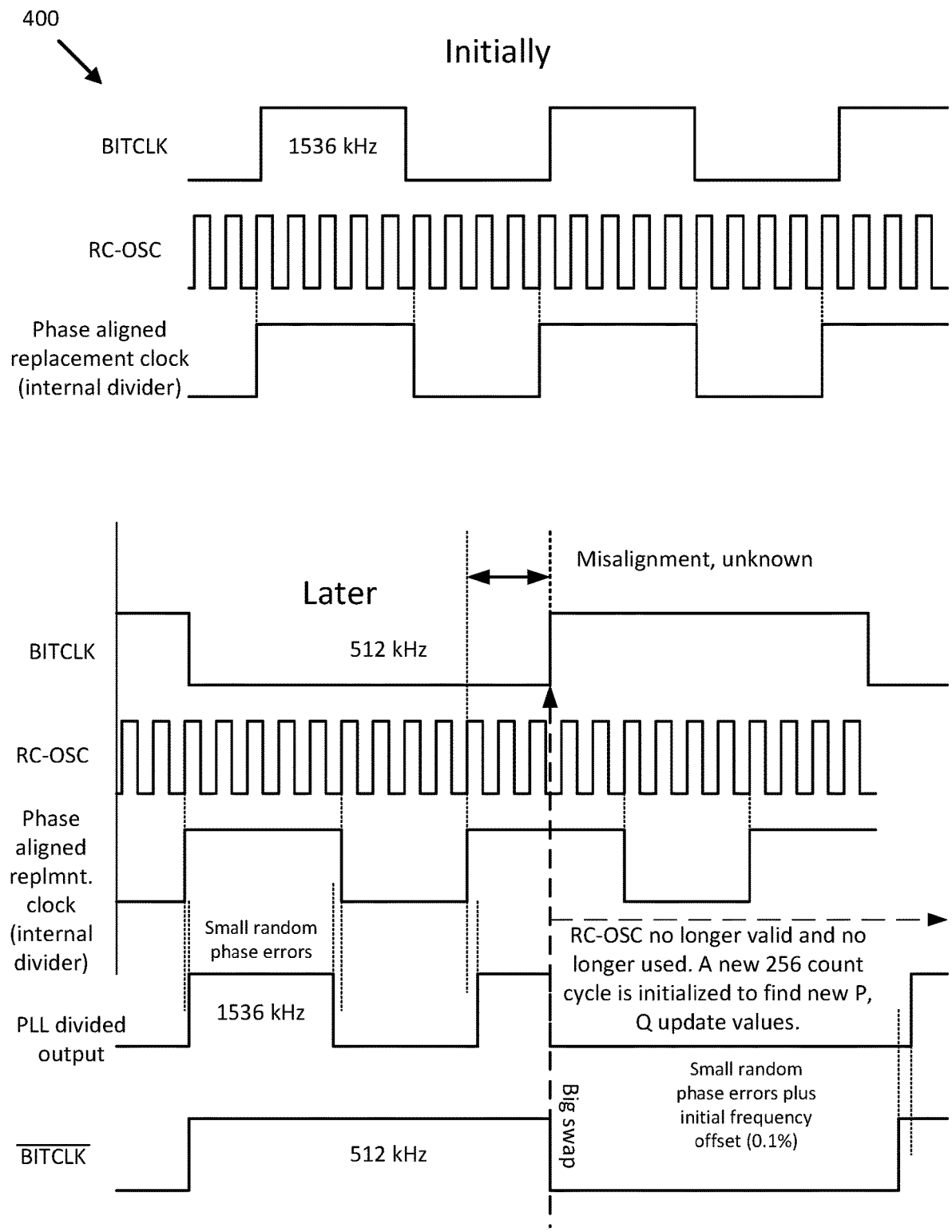
FIG. 4 is a timing plot illustrating a data clock frequency or time-base transition in a PLL based clock generator, in accordance with one or more embodiments of the present disclosure.

FIG. 4 is a timing plot 400 illustrating a data clock frequency or time-base transition or swap in module data clock BITCLK provided to PLL clock generator 140, in accordance with one or more embodiments of the present disclosure. In particular, it can be seen in FIG. 4 that the 'big' swap from 1536 kHz to 512 kHz can result in an invalid validity state of module data clock BITCLK as reported by module data clock validity detector 174. Under such circumstances, a phase comparator input may be changed to an inverted BITCLK, loop divider accumulator 166 may have its value reset and the inverted BITCLK may be used as the phase reference, such as for data clock tracker module 154, and secondary clock input 143 can be ignored. For example, such a big swap should happen before 256 valid cycles of BITCLK have occurred, otherwise secondary clock input 143 will suddenly change without PLL core 160 being correctly adjusted.

At the bottom of FIG. 4 is shown a change from the use of secondary clock input 143 (generated by subsystem alternate clock source (RC-OSC) 111) as the PLL frequency reference to the use of module data clock BITCLK. The challenge is that module data clock BITCLK is not necessarily phase aligned with secondary clock input 143. In order to avoid jumps in the PLL output, an alignment between the phase of the output of PLL core 160 and module data clock BITCLK may be maintained. The basic idea is that the PLL feedback divider will be reset when a change in the data clock happens, in order that it is aligned with the new clock source. By doing this, embodiments avoid a transient state (e.g., where the feedback divider output is misaligned with the new clock source), thereby avoiding a transient change in the PLL output frequency. This way, the PLL output is kept more stable. Thus, this may be solved by resetting loop divider 164 whenever this situation occurs (i.e. a change in PLL input reference) so that the PLL output divider uses the inverted module data clock BITCLK as the phase reference at the same time the divider is reset (i.e. occurring at the positive going edge of the inverted module data clock BITCLK). It is also possible to set loop divider 164 to half the division value at the low-high transition of the direct module data clock BITCLK. After the change in PLL phase reference has occurred, the BT audio samples will again be used for data clock tracker module 154. Because secondary clock input 143 may have drifted in frequency since the last time the exact frequency was measured, the calibration may be restarted using subsystem clock calibrator 182, resulting in a fractional divider correction value P/Q that will be used as the divider value for loop divider 164 if the BT signal is lost again.

Module reference clock loss detector 176 may be implemented as a relatively fast-acting module (e.g., producing a logic-state evaluation of module reference clock BT_CLK within a fraction of a reference clock cycle—such as within a clock cycle of subsystem clock source 111 and/or subsystem reference clock 144) configured to determine whether module reference clock BT_CLK (e.g., 1.500 MHz) provided by module reference clock source 136 is missing or otherwise undetectable. Module reference clock loss detector 176 may be configured to encode the loss state of the module reference clock in logic and forward the loss state (e.g., as a binary loss state signal) to clock select logic module 170.

More generally, module reference clock loss detector 176 may be used for instantaneous switching between module reference clock input 141 and secondary clock input 143 to provide a reference clock for PLL core 160 and/or PLL clock generator 140. Module reference clock loss detector 176 should detect the absence of module reference clock BT_CLK and/or associated pulse width modulated (PWM) pulses from communications module 130 and activate a clock loss detect output forwarded to clock select logic module 170. Secondary clock input 143 may be used to check the validity of module data clock BITCLK, as shown in module data clock validity detector 174, and if it disappears, PLL clock generator 140 should change the PLL divisor feedback generated by loop divider 164 and the divider value of PLL input divider 162 to accommodate secondary clock input 143/subsystem alternate clock source (RC-OSC) 111 instead. When secondary clock input 143 is enabled as a reference clock to PLL core 160, the λ-tracking should be disabled, and the previous calculated values (e.g., for the RC-OSC output/secondary clock input 143 calibrated using process 360 of FIG. 3C and/or similar techniques) should be stored and kept in order to not negatively affect operation of PLL core 160. In other words, the previous and optimized clock correction settings should be maintained when module reference clock BT_CLK disappears because during BT clock loss an audio sample clock reference (BITCLK) will no longer be received.

Figure 5:
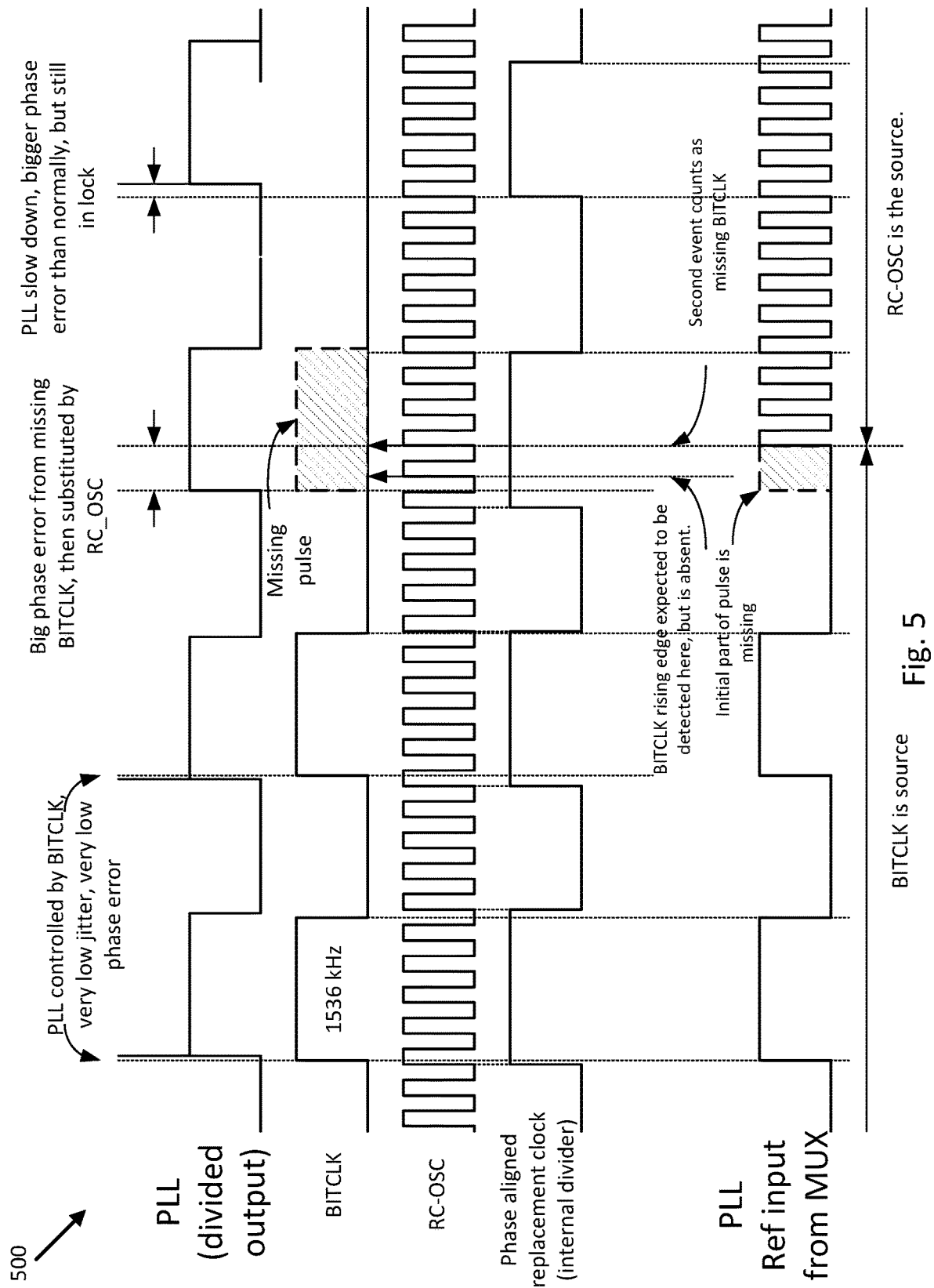
FIG. 5 is a timing plot illustrating a clock source transition from a reference clock input to a subsystem clock input in a PLL based clock generator, in accordance with one or more embodiments of the present disclosure.

FIG. 5 is a timing plot 500 illustrating a clock source transition from module reference clock input 141 to subsystem clock input 143 in PLL clock generator 140, in accordance with one or more embodiments of the present disclosure. In particular, it can be seen in FIG. 5 that the loss of module reference clock BT_CLK and/or module data clock BITCLK can result in a loss state of module reference clock BT_CLK and/or module data clock BITCLK as reported by module reference clock loss detector 176. Under such circumstances, PLL clock generator 140 may be configured to reconfigure various elements of PLL clock generator 140 (e.g., via clock selector signal SEL generated by clock select logic module 170) to use secondary clock input 143 as the reference clock for PLL core 160. Here, the output from subsystem alternate clock source (RC-OSC) 111 is already aligned with the PLL input reference, so that if BT_CLK is lost, it will already be aligned with the expected pattern by PLL core 160.

Module reference clock validity detector 178 may be configured to detect the presence of a valid module reference clock BT_CLK and determine whether it is stable and in the expected correct frequency range, similar to the operation of module data clock validity detector 174. On some BT chips module reference clock BT_CLK will have a different name and frequency, but it is generally implemented as the original BT/module clock 138 (e.g., 24.00 or 26.00 MHz) divided by an integer inside the BT chip and exported or used as the primary PLL clock reference (e.g., module reference clock input 141). In various embodiments, module reference clock validity detector 178 may be configured to generate a valid high signal/reference clock validity status when a valid module reference clock has been detected. More generally, module reference clock validity detector 178 may be configured to check the module reference clock BT_CLK and provide a logic indicator/reference clock validity status when a valid clock signal is present. In some embodiments, operation of module reference clock validity detector 178 may be based on clock cycles from module reference clock input 141 and secondary clock input 143. If the number of clock cycles from secondary clock input 143 is the same as the previous cycle count (or, for example, at most, plus or minus 2), then this will be accepted as a valid clock input. The frequency may further be checked to be in the range 0.2-4.0 MHz, as described herein.

The reason there is both a reference clock valid detector and a reference clock loss detector is that reference clock validity detector 178 can be slow to register a valid or invalid clock signal, while module reference clock loss detector 176 can react within a fraction of a data clock cycle, as described herein. In FIG. 1B, module reference clock BT_CLK is indicated as 1.500 MHz, but other chips or other operating modes might provide other module reference clock frequencies, such as 1.00 MHz or 3.00 MHz, for example.

Clock select logic module 170 may be configured to monitor the various logic outputs of module data clock validity detector 174, module reference clock loss detector 176, and/or module reference clock validity detector 178, for example, and generate clock selector signal SEL based on such logic outputs. For example, clock select logic module 170 may be configured to generate a DEFAULT clock selector signal SEL only when all of module data clock validity detector 174, module reference clock loss detector 176, and module reference clock validity detector 178 indicate a valid clock and not a clock loss, for example, and to generate a BACKUP clock selector signal SEL when any of module data clock validity detector 174, module reference clock loss detector 176, and/or module reference clock validity detector 178 indicate an invalid clock and/or a clock loss, as described herein. In some embodiments, clock select logic module 170 may be configured to generate a BACKUP clock selector signal SEL according to override select signal 171 (e.g., generated by control logic 112 and/or host device 108) regardless of the logic states output by module data clock validity detector 174, module reference clock loss detector 176, and/or module reference clock validity detector 178.

Clock selector signal SEL may be forwarded to one or more of reference signal multiplexor 180, PLL input divider 162, select register 152, data clock tracker module 154, and/or other elements of PLL clock generator 140, for example, to reconfigure PLL clock generator 140 to operate according to secondary clock input 143. For example, reference signal multiplexor 180 may be configured to route and/or select between the primary module reference clock input 141 and the alternate secondary clock input 143 provided by the less precise subsystem clock source (RC-OSC) 111, for example, based on reference/secondary clock selector signal SEL. In particular, reference signal multiplexor 180 may be configured to couple or route secondary clock input 143 to PLL input divider 162, and PLL input divider 162 may be configured to change the divider value it applies to its input clock reference signal (e.g., module reference clock input divider value, or a secondary clock input divider value), when provided a BACKUP clock selector signal SEL. Select register 152 may be configured to store at least two PLL control words: one for the primary module reference clock source mode (word 1—a DEFAULT clock divider value) and one for the alternate secondary subsystem clock source (RC-OSC) substitution mode (word 2—a BACKUP clock divider value), where the selection between the two PLL control words may be based on reference/secondary clock selector signal SEL. Select register 152 may be configured to provide at least a portion of the module reference clock source control word (the DEFAULT clock divider value) when provided a DEFAULT clock selector signal SEL, and to provide at least a portion of the alternate subsystem clock source control word when provided a BACKUP clock selector signal SEL. Data clock tracker module 154 may be configured to disable data clock tracking, provide a null audio/data clock correction factor to loop divider adjuster/delta sigma modulator 165, and/or use the last calculated optimal division value when using RC-OSC/secondary clock input 143 as the PLL reference (e.g., before switching to secondary clock input 143), when provided a BACKUP clock selector signal SEL.

Figure 1C:
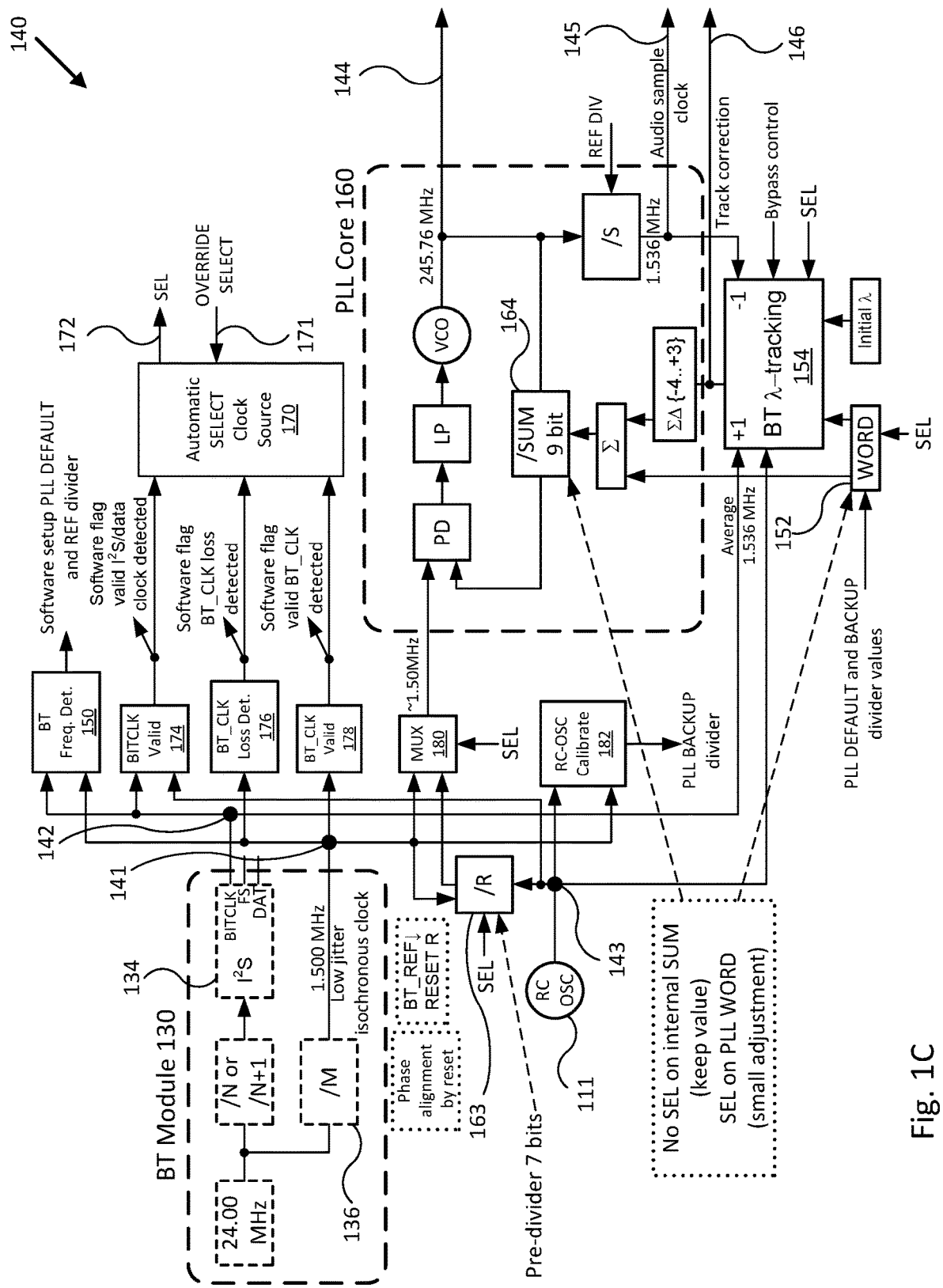
FIG. 1C is a block diagram of a PLL based clock generator, in accordance with one or more embodiments of the present disclosure.

In general, secondary clock input 143 is not well defined due to process voltage temperature (PVT) variations in subsystem clock source (RC-OSC) 111. Subsystem clock calibrator 182 may be configured to measure the frequency of secondary clock input 143 accurately, similar in operation to module data clock frequency detector 150 and the process illustrated by graph 200 in FIG. 2, but typically performed using a longer measurement time than when measuring the module data clock frequency to ensure an accurate setting for PLL core 160 when secondary clock input 143 is used. For example, subsystem clock calibrator 182 may be configured to take the current PLL frequency control variable or word (e.g., the BACKUP divider value) and calibrate secondary clock input 143, so that a new PLL control variable or word is generated (e.g., an updated BACKUP clock divider value). If the tracking loop is mainly implemented in software, a method such as shown in FIG. 3C may be used for the calibration and tracking of PVT changes in subsystem clock source (RC-OSC) 111. If module reference clock BT_CLK is lost due to poor BT signal conditions, PLL clock generator 140 will detect this loss and select secondary clock input 143 generated by subsystem clock source (RC-OSC) 111 instead of module reference clock BT_CLK and automatically change the divider value provided to loop divider 164 to a new and calibrated value generated by subsystem clock calibrator 182, as shown in FIGS. 1B-C. Furthermore, embodiments may be configured to determine a very precise calibration value (e.g., 0.01%) and continuously track any PVT variations of the RC-OSC and other circuits. This may require continuous tracking of the RC-OSC frequency so that an accurate and recent estimate is available if the BT signal is lost.

With M=15000, the frequency estimate has a resolution of 100 Hz at a measurement time of 10 ms. The simplified frequency detection process illustrated by FIG. 2 may be used to perform a scaling between module reference clock BT_CLK and secondary clock input 143 and include the calibrated BACKUP divider value in the calculation. Thus, embodiments determine BACKUP divider value=Old_BACKUP divider value x Freq_secondary clock input 143/Freq_module reference clock BT_CLK. This would in principle require the measurement of two clock frequencies and performing one multiplication and one division. However, by using the dual-slope principle, both the division and multiplication operations may be avoided, and embodiments will provide a very precise output value due to the averaging over multiple clock cycles. The routine may be a bit slow due to the use of a calculation time of Old BACKUP divider value-cycles of the module reference clock BT_CLK. Thus, calibration may take tens of milliseconds. However, the associated power consumption is very low because the numerical operations are dominated by incrementing and decrementing counters by one thereby giving a power consumption of approximately two DFF's operating at the maximum of (Freq_secondary clock input 143+Freq_module reference clock BT_CLK).

FIG. 1C is a block diagram of PLL clock generator 140, in accordance with one or more embodiments of the present disclosure, that differs from PLL clock generator 140 in FIG. 1B by including phase aligning PLL input divider 163 external to PLL core 160 in place of PLL input divider 162. When module reference clock BT_CLK disappears, it should be replaced with secondary clock input 143; however, there is uncertainty associated with the operation of subsystem clock source (RC-OSC) 111, which generates secondary clock input 143. If the uncertainty isn't compensated for or corrected, there is a high risk of PLL core 160 losing lock. Assuming a secondary clock frequency of 40 MHz+/−2% and a divider of 26 to reach about 1.5 MHz, then it will take ½×(1/0.02)×26/(4×10⁻⁷) to get a phase error of 180%. This is equal to 16.25 μs. Thus, if the low pass filter of PLL core 160 has a narrower bandwidth than this (i.e. the bandwidth is less than about 60 kHz), then the PLL will lose lock unless a pre-calibration of secondary clock input 143 is performed.

There are various requirements for PLL core 160 maintaining lock during an input switch. For example, it may be required that there is no phase jump when PLL clock generator 140 switches clock sources. This is most easily accomplished by switching to a clock source that is close in frequency to and phase aligned with module reference clock BT_CLK (1.5 MHz). The phase alignment can be accomplished by resetting the divide-by-N counter forming phase aligning PLL input divider 163 whenever there is a high-to-low transition in module reference clock BT_CLK, as illustrated in FIGS. 1C and 5. It can be determined that the RC-OSC divided output (shown below the RC-OSC output) is phase-aligned with BITCLK by looking at the rising edges of BITCLK and adjusting the phase of phase aligning PLL input divider 163 (e.g. by resetting this divider whenever there is a falling edge on BITCLK). Loop divider 164 should not itself be changed, but the BACKUP divider value should be selected and match the correct calibrated value. Notice, the previous 4-bit input divider 162 (e.g., an R counter) may be replaced with a divider/counter 163 with a different word length as compared to PLL input divider 162; such replacement may depend on the desired/operational operating frequency. To avoid PLL core 160 losing lock temporarily when switching inputs, secondary clock input 143 should be periodically calibrated using subsystem/secondary clock calibrator 182 (e.g. approximately at least once per second) to correct for changes in frequency over time (e.g., due to a changing temperature).

In various embodiments, PLL clock generator 140 may be configured to setup all registers and programming. However, there is a compromise between functionality and system complexity. The control words that determine the PLL frequency for PLL core 160 are not encoded in a linear format and the fractional part of PLL core 160 may include a factor of approximately 7, as identified in equation (1), depending on design considerations when delta sigma modulator 165 is implemented. Therefore, instead of PLL clock generator 140 automatically calculating all the required control words for PLL core 160, only the correction factor provided by data clock tracker module 154 will be automatically calculated, while the register settings for the fractional PLL divider of PLL core 160 will be calculated in software (including the factor of 7), because the division equation is not linear between the fractional and integer part. However, PLL clock generator 140 may be configured to provide the exact information that is required to calculate the required PLL control words and only a few lines of code (e.g., executed by control logic 112) is required to calculate the setup words.

In some embodiments, PLL clock generator 140 should include a bank switch module configured to switch the clock input from module reference clock input 141 to secondary clock input 143 and at the same time swap the register settings from the DEFAULT PLL settings to the BACKUP settings associated with secondary clock input 143. When the switching happens, the data clock tacker module 154 should be disabled to avoid problems with frequency drift, since there is no longer a module data clock present. It should be noted, that when no BT audio data are present, a headset will be limited in functionality to e.g. ANC (automatic noise cancellation), but no playback is possible when the link is broken.

Figure 6:
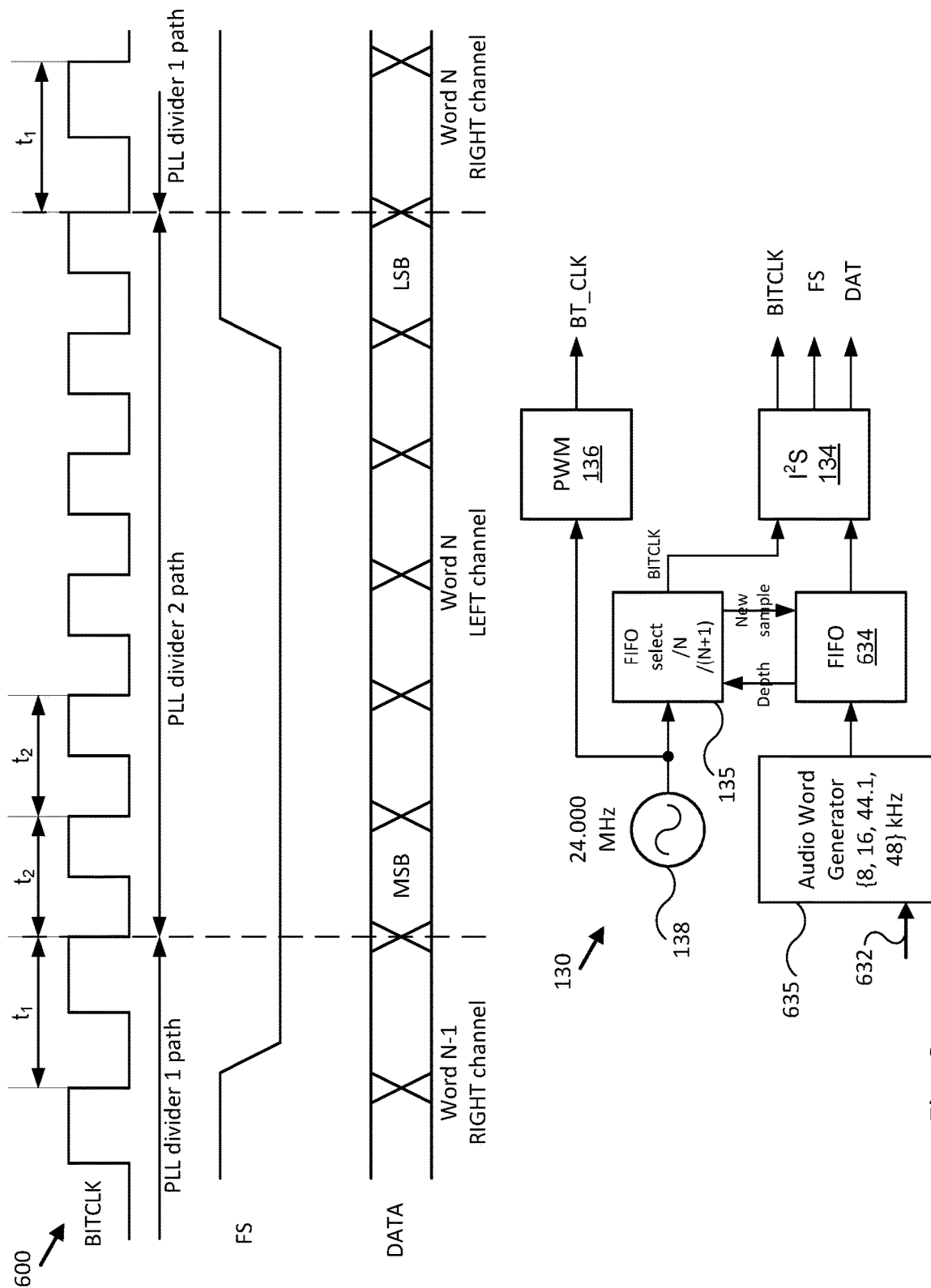
FIG. 6 includes a block diagram of a communications module and a timing plot illustrating data output by the communication module and a data clock frequency or time-base transition in a data clock provided to a PLL based clock generator, in accordance with one or more embodiments of the present disclosure.

FIG. 6 includes a block diagram of communications module 130 and a timing plot 600 illustrating data output by communications module 130 and a data clock frequency or time-base transition in a data clock provided to PLL clock generator 140, in accordance with one or more embodiments of the present disclosure. In FIG. 6, communications module 130 includes first in first out (FIFO) buffer 634 configured to receive audio data words generated according to various sample rates from audio word generator 635 and use the received audio data words to control divisor values for data rate selector/duty cycle divider 135 and provide audio data words to data source 134 according to appropriate data and clock timing, as described herein. Data source 134 may be configured to generate and/or provide module data clock BITCLK, frame select signal FS, and audio data stream DAT. Audio word generator 635 may be configured to receive raw or compressed wireless audio data over a wireless communication link via input 632, for example, and generate corresponding audio data words to FIFO buffer 634. Timing plot 600 illustrates a swap between two different data clock frequencies while a data stream is provided by data source 134. Normally, such link may be bi-directional, but only one path is shown for simplicity. The system in FIG. 6 solves the problem of alignment between the module data clock and the module reference clock by choosing between two different BITCLK frequencies. Other solutions are possible to generate a stable audio clock, either directly from the BT reference clock, including a PLL or ASRC inside the PLL module, or by other means.

Figure 7:
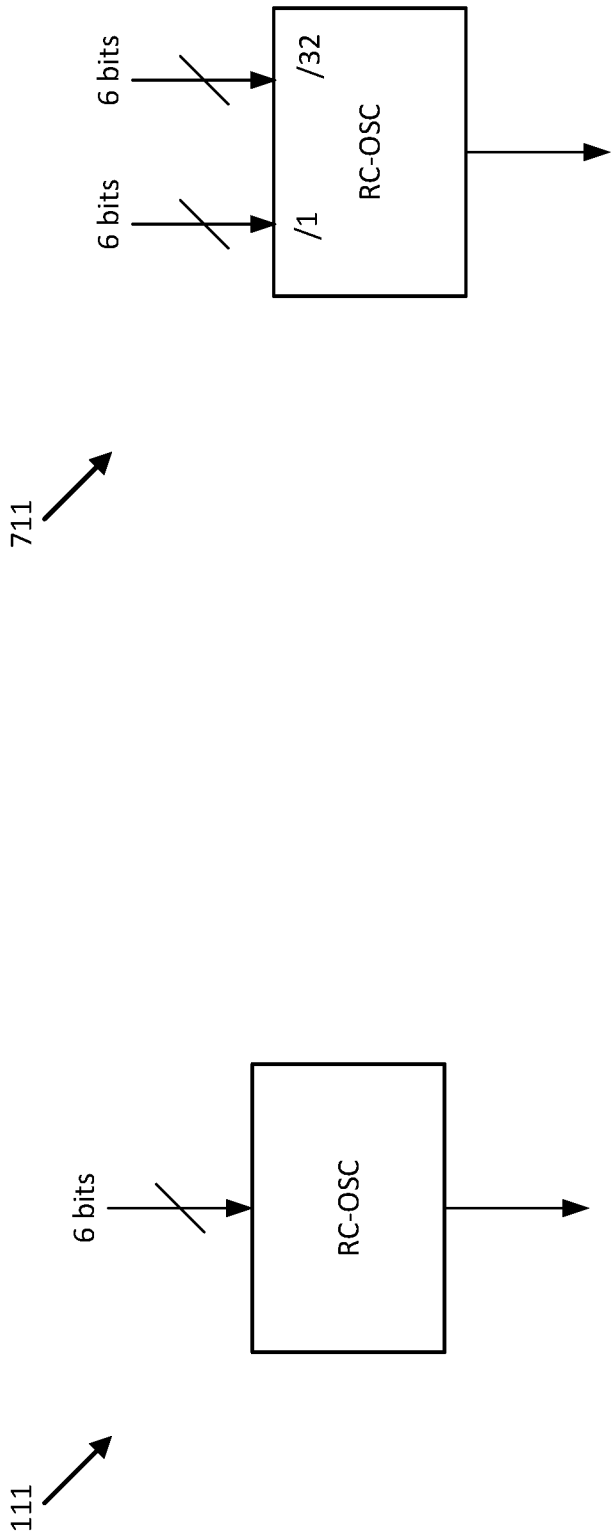
FIGS. 7A-7B are each a block diagram of a subsystem clock source for a PLL based clock generator, in accordance with one or more embodiments of the present disclosure.

FIGS. 7A-B are each a block diagram of subsystem clock source 111 for PLL clock generator 140, in accordance with one or more embodiments of the present disclosure. If subsystem clock source 111 is to be used as the direct reference clock for PLL clock generator 140 and/or the entirety of audio subsystem 110, subsystem clock source 111 may be calibrated in the analog domain, so as to be able to provide a relatively precise clock for audio subsystem 110 without needing to turn off various DSP provided by DSP 116, including ANC, before enabling subsystem clock source 111 as the direct reference clock. One relatively resource-intensive way to accomplish this is to include a relatively high precision DAC in subsystem clock source 111 to obtain a relatively very precise audio clock reference. Another less resource-intensive way to accomplish this is provided herein. In an alternative approach, the PLL may not be needed during low power audio playback by calibrating the RC-OSC before switching the PLL and BT system off.

For example, subsystem clock source 111 typically only has 6 bits to adjust the its frequency, as shown in FIG. 7A. As such, it may be difficult to obtain an accuracy of 10 bits or more, due to the precision required. However, it is possible to replicate the existing 6-bit DAC structure already designed for subsystem clock source 111 and scale the output of the additional 6-bit DAC by 1/32 and sum the resulting two analog signals to generate a more precisely selectable subsystem clock source. FIG. 7B illustrates an embodiment of such staggered DAC subsystem clock source 711. The procedure to program subsystem clock source 711 is then as follows: (1) set the primary DAC input (divided by 1) to the desired value, while keeping the secondary DAC input (divided by 32) at a mid-value; (2) perform a frequency calibration of staggered DAC subsystem clock source 711; (3) adjust the primary DAC input as needed towards the desired frequency; (4) fine adjust the secondary DAC input as needed towards the desired frequency. Such process may include repeating steps 2 and 3 multiple times, for example, or a combination of steps 2 and 4 multiple times. Because each of the two controls are monotonic, the combination is also monotonic. In various embodiments, it is beneficial to scale the secondary DAC output by a factor of 1/32 instead of 1/64 to ensure there is some overlap between the ranges (it is assumed each individual DAC is no more accurate than 6 bits). The adjustment in frequency should be repeated on a regular basis, e.g. every 10 seconds to ensure all circuits are aligned even with drift in temperature and voltage. Embodiments of staggered DAC subsystem clock source 711 should have an adjusted accuracy of 0.05%. This will result in a potential frequency drift of 1 Hz for a 2 kHz signal, which should be inaudible. In this way, embodiments can either maintain the same PLL divisor value when the BT reference clock is lost—or if the jitter of the RC-OSC is low enough, completely switch off the entire PLL section during low power playback and rely on RC-OSC alone.

It is recommended to pick a subsystem clock source and a divider value for PLL input divider 162/163 from the following table of frequencies (in order to pick a close fit to a desired subsystem data clock frequency) to maintain compatibility with a module reference clock of 24 MHz or a divided value of such module reference clock:

| Divisor R in table | RC-OSC (approx.) ± 2% | | | |
|---|---|---|---|---|
| BT REF (24 MHz/M) | ~30 MHz | ~36 MHz | ~42 MHz | ~48 MHz |
| 1.000 | 30 | 36 | 42 | 48 |
| 1.500 | 20 | 24 | 28 | 32 |
| 2.000 | 15 | 18 | 21 | 24 |
| 3.000 | 10 | 12 | 14 | 16 |
| 6.000 | 5 | 6 | 7 | 8 |

As such, a reference clock switch (e.g., from module reference clock input 141 to secondary clock input 143) may proceed as follows: calibrate secondary clock input and generate new BACKUP and REF divider values (for the PLL integer and fractional part) ready; every time module reference clock BT_CLK (24.00 MHz/M, e.g. 1.500 MHz) generates a negative edge, reset PLL input divider 162/163 that divides by R, which ensures the divider counter and the REF CLOCK are phase aligned; choose a correct division rate for R, similarly to the table above (the divided secondary clock input should be close, but not necessary to be equal to module reference clock BT_CLK); when the clock source is changed, the old SUM value inside PLL core 160 is retained in order to maintain stability of PLL core 160; when the clock source is changed, the PLL control WORD (both the integer and fractional part) should change. This will ensure an alignment of both frequency and phase between the original module reference clock and the RC-OSC replacement. If the BT clock reappears again, there is no simple way to swap the clock reference back to the BT clock while ensuring the phase is aligned. Under this circumstance, one can simply wait until the RC-OSC and module reference clocks are phase aligned, which will happen in a finite time due to the variation of RC-OSC. If the RC-OSC output is to be used as a direct audio clock and replacing PLL core 160, the frequencies should be targeted towards common audio frequencies like 3.072 MHz times an integer, instead of the table, that shows values targeted towards 6 MHz times an integer.

Figure 8:
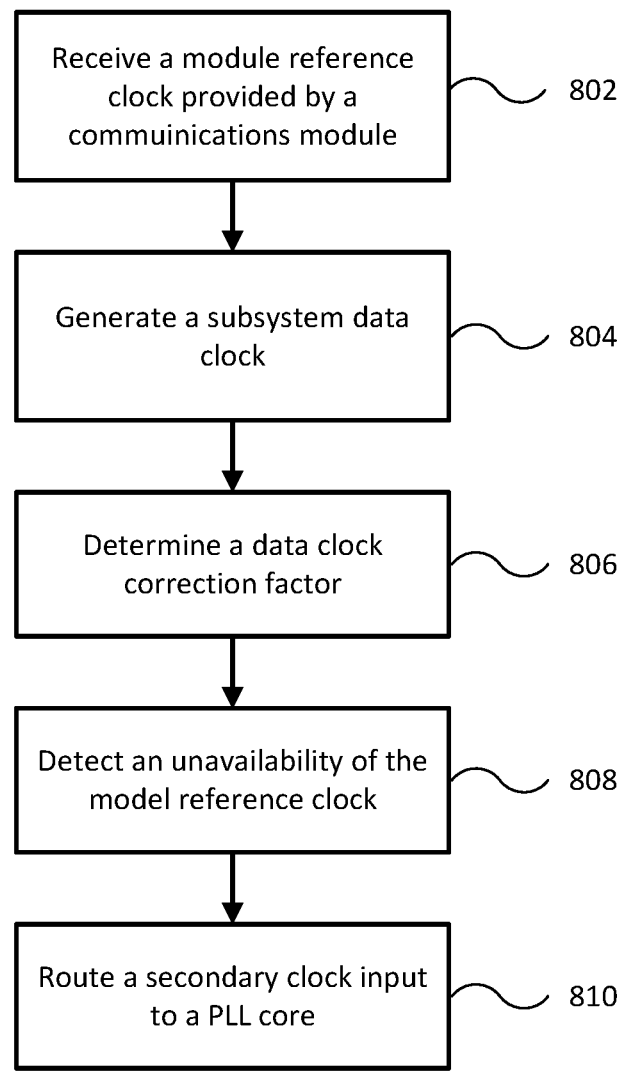
FIG. 8 is a flow diagram illustrating an example process for operating a PLL based clock generator, in accordance with one or more embodiments of the disclosure.

FIG. 8 is a flow diagram illustrating an example process for operating PLL clock generator 140, in accordance with one or more embodiments of the disclosure. At block 802, PLL clock generator 140 receives module reference clock BT_CLK provided by communications module 130. At block 804, PLL clock generator 140 generates a subsystem data clock, such as subsystem data clock 145 corresponding to module data clock BITCLK provided by communications module 130. At block 806, PLL clock generator 140 determines a data clock correction factor. For example, data clock tracker module 154 may be configured to receive module data clock BITCLK and subsystem data clock 145 and determine a data clock correction factor based, at least in part, on the received module data and subsystem data clocks BITCLK and 145. At block 808, PLL clock generator 140 detects an unavailability of model reference clock BT_CLK. At block 810, PLL clock generator 140 routes secondary clock input 143 to PLL core 160. Accordingly, embodiments described herein are able to provide relatively stable and jitter free reference and data clocks even while swapping between data clock frequencies and/or switching reference clock inputs, as described herein.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A phase-locked loop (PLL) clock generator comprising:
   a PLL core having an input to receive, from a communications module, a reference signal having a first frequency, the PLL core being configured to generate a subsystem data clock signal based, at least in part, on the reference signal and adjust the subsystem data clock signal based, at least in part, on a data clock correction factor; and
   a data clock tracker module configured to receive, from the communications module, a module data clock signal having a second frequency that varies in relation to the first frequency and to determine the data clock correction factor based, at least in part, on the module data clock signal and the subsystem data clock signal, wherein the PLL core is further configured to:
   increment the data clock correction factor by an update gain responsive to each transition of the module data clock signal in a first direction; and
   decrement the data clock correction factor by the update gain responsive to each transition of the subsystem data clock signal in the first direction.

2. The PLL clock generator of claim 1, wherein:
each transition of the module data clock signal in the first direction represents a positive edge of the module data clock signal; and
each transition of the subsystem data clock signal in the first direction represents a positive edge of the subsystem data clock signal.

3. The PLL clock generator of claim 1, wherein the data clock tracker module is further configured to:
count a number of positive edges of the module data clock signal and a number of positive edges of the subsystem data clock signal over an accumulation period;
accumulate a number of PLL corrections based, at least in part, on a difference between the number of positive edges of the module data clock signal and the number of positive edges of the subsystem data clock signal counted over the accumulation period; and
adjust at least one of the update gain or a duration of the accumulation period based, at least in part, on the number of accumulated PLL corrections.

4. The PLL clock generator of claim 1, further comprising:
a data clock frequency detector configured to receive the module data clock signal from the communications module and estimate the second frequency, wherein the data clock correction factor is determined based, at least in part, on the estimate of the second frequency.

5. The PLL clock generator of claim 1, further comprising:
a data clock frequency detector configured to receive the module data clock signal from the communications module and estimate the second frequency, wherein the subsystem data clock signal is generated based, at least in part, on the estimate of the second frequency.

6. The PLL clock generator of claim 1, further comprising:
a subsystem clock source configured to generate a subsystem clock signal;
a module reference clock loss detector configured to detect an availability of a module reference clock signal;
a clock select logic module configured to generate a clock selector signal based, at least in part, on the availability of the module reference clock signal; and
a reference signal multiplexor configured to provide the subsystem clock signal or the module reference clock signal, as the reference signal, to the PLL core based on the clock selector signal.

7. The PLL clock generator of claim 6, further comprising:
a module data clock validity detector configured to determine a validity of the module data clock signal based, at least in part, on the second frequency; and
a module reference clock validity detector configured to determine a validity of the module reference clock signal based, at least in part, on the first frequency, wherein the clock select logic module further generates the clock selector signal based, at least in part, on the validity of the module data clock signal and the validity of the reference clock signal.

8. The PLL clock generator of claim 6, wherein the PLL core includes:
a PLL input divider configured to apply a module reference clock input divider value or a secondary clock input divider value to the signal received at the input of the PLL core based, at least in part, on the clock selector signal.

9. The PLL clock generator of claim 6, wherein the data clock tracker module is further configured to selectively null the data clock correction factor based, at least in part, on the clock selector signal.

10. The PLL clock generator of claim 6, further comprising:
a phase aligning PLL input divider configured to apply an input divider value to the subsystem clock signal and reset a counter associated with the input divider value responsive to one or more transitions of the module reference clock signal in a second direction opposite the first direction.

11. The PLL clock generator of claim 6, further comprising:
a subsystem clock calibrator configured to estimate a frequency of the subsystem clock signal based, at least in part, on the module reference clock signal, wherein the subsystem data clock signal is generated based, at least in part, on the estimated frequency of the subsystem clock signal.

12. A method performed by a phase-locked loop (PLL) clock generator, comprising:
receiving, from a communications module, a reference signal having a first frequency and a module data clock signal having a second frequency that varies in relation to the first frequency;
generating a subsystem data clock signal based, at least in part, on the reference signal;
determining a data clock correction factor based, at least in part, on the module data clock signal and the subsystem data clock signal;
incrementing the data clock correction factor by an update gain responsive to each transition of the module data clock signal in a first direction;
decrementing the data clock correction factor by the update gain responsive to each transition of the subsystem data clock signal in the first direction; and
adjusting the subsystem data clock signal based, at least in part, on the data clock correction factor.

13. The method of claim 12, wherein:
each transition of the module data clock signal in the first direction represents a positive edge of the module data clock signal; and
each transition of the subsystem data clock signal in the first direction represents a positive edge of the subsystem data clock signal.

14. The method of claim 12, further comprising:
counting a number of positive edges of the module data clock signal and a number of positive edges of the subsystem data clock signal over an accumulation period;
accumulating a number of PLL corrections based, at least in part, on a difference between the number of positive edges of the module data clock signal and the number of positive edges of the subsystem data clock signal counted over the accumulation period; and
adjusting at least one of the update gain or a duration of the accumulation period based, at least in part, on the number of accumulated PLL corrections.

15. The method of claim 12, further comprising:
generating a subsystem clock signal;
detecting an availability of a module reference clock signal;
generating a clock selector signal based, at least in part, on the availability of the module reference clock signal; and selecting the subsystem clock signal or the module reference clock signal, as the reference signal, based on the clock selector signal.

16. The method of claim 15, wherein the generating of the clock selector signal comprises:
determining a validity of the module data clock signal based, at least in part, on the second frequency; and
determining a validity of the module reference clock signal based, at least in part, on the first frequency, the clock selector signal further being generated based, at least in part, on the validity of the module data clock signal and the validity of the reference clock signal.

17. The method of claim 15, further comprising:
applying a module reference clock input divider value or a secondary clock input divider value to the module reference clock signal or the subsystem clock signal based, at least in part, on the clock selector signal.

18. The method of claim 15, further comprising:
nulling the data clock correction factor responsive to the clock selector signal being set to a backup state.

19. The method of claim 15, further comprising:
applying an input divider value to the subsystem clock signal; and
resetting a counter associated with the input divider value responsive to one or more transitions of the module reference clock signal in a second direction opposite the first direction.

20. The method of claim 15, wherein the generating of the subsystem data clock signal comprises:
estimating a frequency of the subsystem clock signal based, at least in part, on the module reference clock signal, wherein the subsystem data clock signal is generated based, at least in part, on the estimated frequency of the subsystem clock signal.

* * * * *